(12) United States Patent
Kondo et al.

(10) Patent No.: US 11,927,862 B2
(45) Date of Patent: Mar. 12, 2024

(54) DISPLAY DEVICE HAVING AN OXIDE SEMICONDUCTOR TRANSISTOR

(71) Applicant: Semiconductor Energy Laboratory Co., Ltd., Atsugi (JP)

(72) Inventors: Toshikazu Kondo, Atsugi (JP); Jun Koyama, Sagamihara (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/115,017

(22) Filed: Feb. 28, 2023

(65) Prior Publication Data

US 2023/0258991 A1 Aug. 17, 2023

Related U.S. Application Data

(63) Continuation of application No. 17/209,556, filed on Mar. 23, 2021, now abandoned, which is a
(Continued)

(30) Foreign Application Priority Data

Feb. 26, 2010 (JP) .................................. 2010-042584

(51) Int. Cl.
*G02F 1/1368* (2006.01)
*G02F 1/1333* (2006.01)
(Continued)

(52) U.S. Cl.
CPC ...... *G02F 1/1368* (2013.01); *G02F 1/133345* (2013.01); *G02F 1/136227* (2013.01);
(Continued)

(58) Field of Classification Search
CPC .... B32B 2457/202; H05K 2201/10136; G09G 2300/0478–0495; G02F 1/1362–13685;
(Continued)

(56) References Cited

U.S. PATENT DOCUMENTS

| 4,857,907 A | 8/1989 | Koden |
| 5,028,551 A | 7/1991 | Dohjo et al. |

(Continued)

FOREIGN PATENT DOCUMENTS

| CN | 001934712 A | 3/2007 |
| CN | 101191967 A | 6/2008 |

(Continued)

OTHER PUBLICATIONS

International Search Report (Application No. PCT/JP2011/052676) dated May 24, 2011.
(Continued)

*Primary Examiner* — Tucker J Wright
(74) *Attorney, Agent, or Firm* — Eric J. Robinson; Robinson Intellectual Property Law Office, P.C.

(57) ABSTRACT

An object is to reduce parasitic capacitance of a signal line included in a liquid crystal display device. A transistor including an oxide semiconductor layer is used as a transistor provided in each pixel. Note that the oxide semiconductor layer is an oxide semiconductor layer which is highly purified by thoroughly removing impurities (hydrogen, water, or the like) which become electron suppliers (donors). Thus, the amount of leakage current (off-state current) can be reduced when the transistor is off. Therefore, a voltage applied to a liquid crystal element can be held without providing a capacitor in each pixel. In addition, a capacitor wiring extending to a pixel portion of the liquid crystal display device can be eliminated. Therefore, parasitic
(Continued)

capacitance in a region where the signal line and the capacitor wiring intersect with each other can be eliminated.

4 Claims, 13 Drawing Sheets

Related U.S. Application Data continuation of application No. 16/681,168, filed on Nov. 12, 2019, now Pat. No. 10,983,407, which is a continuation of application No. 15/464,572, filed on Mar. 21, 2017, now Pat. No. 10,539,845, which is a continuation of application No. 14/703,379, filed on May 4, 2015, now Pat. No. 9,658,506, which is a continuation of application No. 13/944,996, filed on Jul. 18, 2013, now Pat. No. 9,048,325, which is a continuation of application No. 13/029,151, filed on Feb. 17, 2011, now Pat. No. 8,502,226.

(51) Int. Cl.
    *G02F 1/1362*      (2006.01)
    *G09G 3/36*      (2006.01)
    *H01L 27/12*      (2006.01)
    *H01L 29/45*      (2006.01)
    *H01L 29/786*      (2006.01)
    *G02F 1/136*      (2006.01)

(52) U.S. Cl.
CPC ..... *G02F 1/136286* (2013.01); *G09G 3/3622* (2013.01); *H01L 27/1225* (2013.01); *H01L 27/1244* (2013.01); *H01L 29/45* (2013.01); *H01L 29/7869* (2013.01); *G02F 1/13606* (2021.01); *G02F 1/13624* (2013.01); *G02F 1/136295* (2021.01); *G02F 2202/10* (2013.01); *G09G 2300/0426* (2013.01)

(58) Field of Classification Search
CPC ... H01L 27/1222–1233; H01L 27/3276–3279; H01L 27/2907
See application file for complete search history.

(56) References Cited

U.S. PATENT DOCUMENTS

| | | |
|---|---|---|
| 5,047,819 A | 9/1991 | Tanaka et al. |
| 5,153,754 A | 10/1992 | Whetten |
| 5,243,202 A | 9/1993 | Mori et al. |
| 5,284,789 A | 2/1994 | Mori et al. |
| 5,367,179 A | 11/1994 | Mori et al. |
| 5,541,748 A | 7/1996 | Ono et al. |
| 5,623,350 A | 4/1997 | Kawachi et al. |
| 5,731,856 A | 3/1998 | Kim et al. |
| 5,744,864 A | 4/1998 | Cillessen et al. |
| 5,798,746 A | 8/1998 | Koyama |
| 5,844,538 A | 12/1998 | Shiraki et al. |
| 5,905,549 A | 5/1999 | Lee |
| 6,067,132 A | 5/2000 | Kim |
| 6,111,619 A | 8/2000 | He et al. |
| 6,294,274 B1 | 9/2001 | Kawazoe et al. |
| 6,451,635 B2 | 9/2002 | Park et al. |
| 6,493,048 B1 | 12/2002 | Baek et al. |
| 6,563,174 B2 | 5/2003 | Kawasaki et al. |
| 6,650,379 B2 | 11/2003 | Baek et al. |
| 6,727,522 B1 | 4/2004 | Kawasaki et al. |
| 6,768,521 B2 | 7/2004 | Baek et al. |
| 6,838,324 B2 | 1/2005 | Yamazaki et al. |
| 6,956,236 B1 | 10/2005 | Sasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,139,045 B2 | 11/2006 | Baek et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,416,681 B2 | 8/2008 | Kim et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito. et al. |
| 7,504,342 B2 | 3/2009 | Park et al. |
| 7,551,257 B2 | 6/2009 | Lee et al. |
| 7,570,327 B2 | 8/2009 | Motoshima et al. |
| 7,605,875 B2 | 10/2009 | Baek et al. |
| 7,652,740 B2 | 1/2010 | Hwang et al. |
| 7,674,650 B2 | 3/2010 | Akimoto et al. |
| 7,675,088 B2 | 3/2010 | Huang et al. |
| 7,687,808 B2 | 3/2010 | Umezaki |
| 7,732,251 B2 | 6/2010 | Hoffman et al. |
| 7,732,819 B2 | 6/2010 | Akimoto et al. |
| 7,737,438 B2 | 6/2010 | Endo et al. |
| 7,777,825 B2 | 8/2010 | Noda et al. |
| 7,791,074 B2 | 9/2010 | Iwasaki |
| 7,791,573 B2 | 9/2010 | Kim et al. |
| 7,804,091 B2 | 9/2010 | Takechi et al. |
| 7,804,174 B2 | 9/2010 | Sasaki et al. |
| 7,816,682 B2 | 10/2010 | Kimura |
| 7,821,009 B2 | 10/2010 | Park |
| 7,863,607 B2 | 1/2011 | Lee et al. |
| 7,872,722 B2 | 1/2011 | Kimura |
| 7,903,190 B2 | 3/2011 | Noda et al. |
| 7,910,490 B2 | 3/2011 | Akimoto et al. |
| 7,910,920 B2 | 3/2011 | Park et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 7,956,947 B2 | 6/2011 | Lee et al. |
| 7,964,876 B2 | 6/2011 | Umezaki |
| 7,977,675 B2 | 7/2011 | Kawamura et al. |
| 8,021,916 B2 | 9/2011 | Akimoto et al. |
| 8,031,312 B2 | 10/2011 | Lim et al. |
| 8,098,342 B2 | 1/2012 | Lee |
| 8,130,354 B2 | 3/2012 | Kimura |
| 8,134,154 B2 | 3/2012 | Gosain et al. |
| 8,143,115 B2 | 3/2012 | Omura et al. |
| 8,148,721 B2 | 4/2012 | Hayashi et al. |
| 8,203,144 B2 | 6/2012 | Hoffman et al. |
| 8,232,552 B2 | 7/2012 | Yano et al. |
| 8,274,077 B2 | 9/2012 | Akimoto et al. |
| 8,319,905 B2 | 11/2012 | Yoon et al. |
| 8,333,913 B2 | 12/2012 | Noue et al. |
| 8,338,865 B2 | 12/2012 | Kimura |
| 8,384,077 B2 | 2/2013 | Yano et al. |
| 8,400,187 B2 | 3/2013 | Yamazaki et al. |
| 8,445,902 B2 | 5/2013 | Sato et al. |
| 8,456,601 B2 | 6/2013 | Lim et al. |
| 8,466,463 B2 | 6/2013 | Akimoto et al. |
| 8,502,217 B2 | 8/2013 | Sato et al. |
| 8,507,303 B2 | 8/2013 | Park |
| 8,530,246 B2 | 9/2013 | Ofuji et al. |
| 8,537,320 B2 | 9/2013 | Kwon et al. |
| 8,598,591 B2 | 12/2013 | Umezaki |
| 8,614,442 B2 | 12/2013 | Park et al. |
| 8,618,545 B2 | 12/2013 | Gosain et al. |
| 8,624,237 B2 | 1/2014 | Yamazaki et al. |
| 8,629,069 B2 | 1/2014 | Akimoto et al. |
| 8,643,583 B2 | 2/2014 | Yoshida |
| 8,647,031 B2 | 2/2014 | Hoffman et al. |
| 8,668,849 B2 | 3/2014 | Noue et al. |
| 8,669,550 B2 | 3/2014 | Akimoto et al. |
| 8,748,879 B2 | 6/2014 | Yano et al. |
| 8,780,307 B2 | 7/2014 | Kimura |
| 8,790,959 B2 | 7/2014 | Akimoto et al. |
| 8,796,069 B2 | 8/2014 | Akimoto et al. |
| 8,803,589 B2 | 8/2014 | Yamazaki et al. |

(56) References Cited

U.S. PATENT DOCUMENTS

| | | |
|---|---|---|
| 8,841,671 B2 | 9/2014 | Kimura |
| 8,872,182 B2 | 10/2014 | Kimura |
| 8,878,172 B2 | 11/2014 | Ito et al. |
| 8,890,781 B2 | 11/2014 | Yamazaki et al. |
| 8,956,900 B2 | 2/2015 | Kwon et al. |
| 8,964,156 B2 | 2/2015 | Kimura |
| 9,048,325 B2 | 6/2015 | Kondo et al. |
| 9,136,389 B2 | 9/2015 | Yamazaki et al. |
| 9,171,492 B2 | 10/2015 | Yoshida |
| 9,268,188 B2 | 2/2016 | Kimura |
| 9,496,406 B2 | 11/2016 | Yamazaki et al. |
| 9,709,861 B2 | 7/2017 | Kimura |
| 9,734,802 B2 | 8/2017 | Yoshida |
| 9,829,761 B2 | 11/2017 | Kimura |
| 10,001,678 B2 | 6/2018 | Kimura |
| 10,509,271 B2 | 12/2019 | Kimura |
| 10,698,277 B2 | 6/2020 | Kimura |
| 11,016,354 B2 | 5/2021 | Kimura |
| 11,061,285 B2 | 7/2021 | Kimura |
| 11,106,096 B2 | 8/2021 | Kimura |
| 11,296,121 B2 | 4/2022 | Yamazaki et al. |
| 11,372,298 B2 | 6/2022 | Kimura |
| 11,435,626 B2 | 9/2022 | Kimura |
| 11,726,371 B2 | 8/2023 | Kimura |
| 2001/0043292 A1 | 11/2001 | Tsujimura et al. |
| 2001/0046027 A1 | 11/2001 | Tai et al. |
| 2002/0009890 A1 | 1/2002 | Hayase. et al. |
| 2002/0056838 A1 | 5/2002 | Ogawa |
| 2002/0132454 A1 | 9/2002 | Ohtsu et al. |
| 2002/0167009 A1 | 11/2002 | Kim |
| 2003/0090599 A1 | 5/2003 | Ochiai et al. |
| 2003/189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0140634 A1 | 6/2005 | Takatori |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118793 A1 | 6/2006 | Yang et al. |
| 2006/0158573 A1 | 7/2006 | Huh et al. |
| 2006/0158577 A1 | 7/2006 | Katakura et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0024773 A1 | 2/2007 | Yamada. et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0164288 A1 | 7/2007 | Oh et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0285593 A1 | 12/2007 | Yamashita |
| 2007/0287296 A1 | 12/2007 | Chang |
| 2008/0006877 A1 | 1/2008 | Mardilovich et al. |
| 2008/0035920 A1 | 2/2008 | Takechi et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054264 A1 | 3/2008 | Huang et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0117348 A1 | 5/2008 | Chen |
| 2008/0128689 A1 | 6/2008 | Lee et al. |
| 2008/0129195 A1 | 6/2008 | Ishizaki et al. |
| 2008/0158457 A1 | 7/2008 | Park et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284929 A1 | 11/2008 | Kimura |
| 2008/0296568 A1 | 12/2008 | Ryu et al. |
| 2008/0308805 A1 | 12/2008 | Akimoto et al. |
| 2009/0001375 A1 | 1/2009 | Yamazaki et al. |
| 2009/0026454 A1 | 1/2009 | Kurokawa. et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0098673 A1 | 4/2009 | Yang et al. |
| 2009/0114910 A1 | 5/2009 | Chang |
| 2009/0115933 A1 | 5/2009 | Mimura |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0174835 A1 | 7/2009 | Lee et al. |
| 2009/0184315 A1 | 7/2009 | Lee et al. |
| 2009/0207328 A1 | 8/2009 | Hur et al. |
| 2009/0250695 A1 | 10/2009 | Tanaka et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025679 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0149138 A1 | 6/2010 | Lee et al. |
| 2010/0320471 A1 | 12/2010 | Takechi et al. |
| 2011/0032435 A1 | 2/2011 | Kimura |
| 2011/0090183 A1 | 4/2011 | Yamazaki et al. |
| 2011/0090416 A1 | 4/2011 | Arasawa et al. |
| 2011/0104851 A1 | 5/2011 | Akimoto et al. |
| 2011/0108832 A1 | 5/2011 | Bae et al. |
| 2011/0121290 A1 | 5/2011 | Akimoto et al. |
| 2011/0134345 A1 | 6/2011 | Yamazaki et al. |
| 2012/0001881 A1 | 1/2012 | Miyake et al. |
| 2012/0168750 A1 | 7/2012 | Hayashi et al. |
| 2014/0061638 A1 | 3/2014 | Umezaki |
| 2015/0084048 A1 | 3/2015 | Hayashi et al. |
| 2016/0380111 A1 | 12/2016 | Yamazaki et al. |
| 2022/0115412 A1 | 4/2022 | Yamazaki et al. |
| 2023/0384639 A1 | 11/2023 | Kimura |

FOREIGN PATENT DOCUMENTS

| | | |
|---|---|---|
| CN | 101246909 A | 8/2008 |
| CN | 101325202 A | 12/2008 |
| CN | 101359692 A | 2/2009 |
| CN | 101572274 A | 11/2009 |
| EP | 0454100 A | 10/1991 |
| EP | 0476701 A | 3/1992 |
| EP | 0542271 A | 5/1993 |
| EP | 1063693 A | 12/2000 |

(56) References Cited

FOREIGN PATENT DOCUMENTS

| | | |
|---|---|---|
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-005378 A | 1/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-010299 A | 1/1989 |
| JP | 01-217422 A | 8/1989 |
| JP | 02-137825 A | 5/1990 |
| JP | 02-240636 A | 9/1990 |
| JP | 04-302289 A | 10/1992 |
| JP | 05-136411 A | 6/1993 |
| JP | 05-251705 A | 9/1993 |
| JP | 06-235934 A | 8/1994 |
| JP | 07-218929 A | 8/1995 |
| JP | 08-264794 A | 10/1996 |
| JP | 10-274782 A | 10/1998 |
| JP | 11-505377 | 5/1999 |
| JP | 11-274504 A | 10/1999 |
| JP | 2000-044236 A | 2/2000 |
| JP | 2000-122089 A | 4/2000 |
| JP | 2000-131719 A | 5/2000 |
| JP | 2000-150900 A | 5/2000 |
| JP | 2000-216403 A | 8/2000 |
| JP | 2001-319876 A | 11/2001 |
| JP | 2002-055326 A | 2/2002 |
| JP | 2002-076356 A | 3/2002 |
| JP | 2002-289859 A | 10/2002 |
| JP | 2002-323707 A | 11/2002 |
| JP | 2003-086000 A | 3/2003 |
| JP | 2003-086808 A | 3/2003 |
| JP | 2004-103957 A | 4/2004 |
| JP | 2004-133422 A | 4/2004 |
| JP | 2004-158243 A | 6/2004 |
| JP | 2004-273614 A | 9/2004 |
| JP | 2004-273732 A | 9/2004 |
| JP | 2006-058730 A | 3/2006 |
| JP | 2006-163367 A | 6/2006 |
| JP | 2006-165527 A | 6/2006 |
| JP | 2006-165528 A | 6/2006 |
| JP | 2006-165529 A | 6/2006 |
| JP | 2006-165532 A | 6/2006 |
| JP | 2007-103918 A | 4/2007 |
| JP | 2007-123861 A | 5/2007 |
| JP | 2007-194594 A | 8/2007 |
| JP | 2007-310180 A | 11/2007 |
| JP | 2008-026435 A | 2/2008 |
| JP | 2008-040343 A | 2/2008 |
| JP | 2008-072025 A | 3/2008 |
| JP | 2008-089674 A | 4/2008 |
| JP | 2008-116502 A | 5/2008 |
| JP | 2008-166716 A | 7/2008 |
| JP | 2008-170749 A | 7/2008 |
| JP | 2008-176262 A | 7/2008 |
| JP | 2009-124136 A | 6/2009 |
| JP | 2009-141002 A | 6/2009 |
| JP | 2009-170905 A | 7/2009 |
| JP | 2009-231664 A | 10/2009 |
| JP | 2009-260002 A | 11/2009 |
| JP | 2009-272427 A | 11/2009 |
| JP | 4404881 | 1/2010 |
| JP | 2010-183108 A | 8/2010 |
| KR | 2001-0011390 A | 2/2001 |
| KR | 2003-0075770 A | 9/2003 |
| KR | 2006-0064264 A | 6/2006 |
| KR | 2007-0068768 A | 7/2007 |
| KR | 2007-0111351 A | 11/2007 |
| KR | 2008-0035773 A | 4/2008 |
| KR | 2009-0078568 A | 7/2009 |
| KR | 2009-0079686 A | 7/2009 |
| KR | 2010-0014141 A | 2/2010 |
| KR | 2010-0060003 A | 6/2010 |
| TW | 452860 | 9/2001 |
| TW | 200420446 | 10/2004 |
| TW | 200627648 | 8/2006 |
| TW | 200643584 | 12/2006 |
| TW | 200814325 | 3/2008 |
| TW | 200919017 | 5/2009 |
| TW | 200952179 | 12/2009 |
| WO | WO-2004/114391 | 12/2004 |
| WO | WO-2005/093850 | 10/2005 |
| WO | WO-2006/064789 | 6/2006 |
| WO | WO-2007/029844 | 3/2007 |
| WO | WO-2008/069056 | 6/2008 |
| WO | WO-2008/069255 | 6/2008 |
| WO | WO-2008/114588 | 9/2008 |
| WO | WO-2008/117810 | 10/2008 |
| WO | WO-2008/136505 | 11/2008 |
| WO | WO-2009/072532 | 6/2009 |
| WO | WO-2009/136645 | 11/2009 |

OTHER PUBLICATIONS

Written Opinion (Application No. PCT/JP2011/052676) dated May 24, 2011.

Coates.D et al., "Optical Studies of the Amorphous Liquid-Cholesteric Liquid Crystal Transition:The Blue Phase", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using Igzo Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2: Distinguished Paper: World-Largest (6.5") Flexible Full Color Top Emission Amoled Display on Plastic Film and Its Bending Properties", SID Digest '09 : SID International Symposium Digest of Technical Papers, May 31, 2009, pp. 983-985.

Lee.M et al., "15.4: Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA Amoled Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA Amoled Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects In ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA Amoled Driven By the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Taiwanese Office Action (Application No. 103118796) dated May 26, 2015.

Taiwanese Office Action (Application No. 103118797) dated May 26, 2015.

Korean Office Action (Application No. 2012-7024493) dated Jul. 6, 2017.

Korean Office Action (Application No. 2018-7031487) dated Dec. 1, 2018.

Chinese Office Action (Application No. 201610889237.9) dated Jan. 20, 2020.

Chinese Office Action (Application No. 201610889237.9) dated Nov. 20, 2020.

Prior Art

DISPLAY DEVICE HAVING AN OXIDE SEMICONDUCTOR TRANSISTOR

TECHNICAL FIELD

The present invention relates to a liquid crystal display device.

BACKGROUND ART

Active matrix liquid crystal display devices including a plurality of pixels arranged in matrix have been widespread. In general, the pixel includes a transistor having a gate electrically connected to a scan line and a source and a drain one of which is electrically connected to a signal line, a capacitor having terminals one of which is electrically connected to the other of the source and drain of the transistor and the other of which is electrically connected to a wiring supplying a common potential (hereinafter, also referred to as a capacitor wiring), and a liquid crystal element having terminals one of which (a pixel electrode) is electrically connected to the other of the source and the drain of the transistor and the one of the terminals of the capacitor and the other of which (a counter electrode) is electrically connected to a wiring supplying a counter potential.

An example of a structure of the above-described pixel is illustrated in FIGS. 13A to 13C. FIG. 13A is a top view of the pixel. Note that FIGS. 13A to 13C are diagrams in which parts (a liquid crystal layer, the counter electrode, and the like) of the liquid crystal element are omitted (a so-called active matrix substrate is illustrated). A pixel 1000 illustrated in FIG. 13A is provided in a region surrounded by a scan line 1001 and a scan line 1002 which are arranged in parallel or substantially parallel to each other and a signal line 1003 and a signal line 1004 which are arranged perpendicularly or substantially perpendicularly to the scan lines 1001 and 1002. Further, the pixel 1000 includes a transistor 1005, a capacitor 1006, and a pixel electrode layer 1007. Note that a conductive layer (a capacitor wiring 1008) which is to be one of electrode layers of the capacitor 1006 is arranged in parallel or substantially parallel to the scan lines 1001 and 1002 and is provided so as to be across the plurality of pixels.

FIG. 13B is a cross-sectional view taken along line A-B in FIG. 13A. The transistor 1005 includes a gate layer 1011 provided over a substrate 1010, a gate insulating layer 1012 provided over the gate layer 1011, a semiconductor layer 1013 provided over the gate insulating layer 1012, one of a source layer and a drain layer 1014a provided over one end of the semiconductor layer 1013, and the other of the source and drain layers 1014b provided over the other end of the semiconductor layer 1013. The capacitor 1006 includes part of the capacitor wiring 1008, an insulating layer (the gate insulating layer 1012) provided over the capacitor wiring 1008, and the other of the source and drain layers 1014b provided over the insulating layer. In addition, the other of the source and drain layers 1014b is electrically connected to the pixel electrode layer 1007 in a contact hole 1016 formed in an insulating layer 1015 provided over the transistor 1005 and the capacitor 1006.

FIG. 13C is a cross-sectional view taken along line C-D in FIG. 13A. The signal line 1003 intersects with the scan line 1001, the capacitor wiring 1008, and the scan line 1002 in a region 1017a, a region 1017b, and a region 1017c respectively with the gate insulating layer 1012 interposed therebetween. Therefore, an upper surface of the signal line 1003 has a convex shape in the regions 1017a, 1017b, and 1017c. Note that it is apparent that the signal line 1004 also has the same upper surface shape as the signal line 1003.

Note that in a liquid crystal display device including the pixel 1000 illustrated in FIGS. 13A to 13C, the scan lines 1001 and 1002 and the capacitor wiring 1008 are formed using the same conductive film, and the gate insulating layer 1012 in the transistor 1005 is also used as a dielectric in the capacitor 1006. That is, it can be said that the liquid crystal display device is a liquid crystal display device whose manufacturing process steps are reduced.

In the pixel 1000 illustrated in FIGS. 13A to 13C, the transistor 1005 has a function of controlling input of a data signal which determines a voltage applied to the liquid crystal element (a potential applied to the pixel electrode layer 1007), and the capacitor 1006 has a function of holding the voltage applied to the liquid crystal element (the potential applied to the pixel electrode layer 1007).

For example, in the case where the dielectric of the capacitor 1006 is formed with a silicon oxide film with a thickness of 0.1 µm, the area of the capacitor 1006 having a capacitance of 0.4 pF is approximately 1160 µm$^2$. Here, when the size of the pixel is 42 µm×126 µm (a 4-inch VGA pixel), the proportion of the area of the capacitor 1006 to the pixel is approximately 22%, which causes a reduction in the aperture ratio. Note that the capacitor 1006 can be eliminated in the above pixel structure. A certain amount of charge can be held without intentionally providing the capacitor 1006 because the liquid crystal element itself has storage capacitance. However, the relative permittivity of liquid crystal is about 3 at the lowest, and the cell gap is 3 µm to 4 µm. Consequently, electrostatic capacitance is approximately ⅟₅₀ of that of the device using the capacitor 1006 having a 0.1-µm-thick silicon oxide film as a dielectric, and therefore, the area of the liquid crystal element is required to be approximately 58000 µm$^2$. Since this size is comparable to that of the pixel with a size of 140 µm×420 µm, the resolution is reduced to approximately 60 ppi and charge can be held only when the liquid crystal display devices have a resolution of 60 ppi or lower. In other words, when pixels are formed with a resolution of 60 ppi or more, the capacitor 1006 is required.

In the liquid crystal display device, by controlling a potential of the scan line 1001, the transistor 1005 is turned on and a potential of the signal line 1003 is controlled as a data signal for the pixel 1000. Thus, a desired voltage can be applied to the liquid crystal element included in the pixel 1000. The voltage is held by the capacitor 1006 for a certain period, so that desired display can be performed in each pixel for a certain period. The liquid crystal display device successively performs such operation for each pixel, whereby images (still images) are formed in a pixel portion. Further, the liquid crystal display device displays a moving image by changing the images successively (e.g., 60 times per second (at a frame frequency of 60 Hz)).

As described above, the moving image is formed of many still images. That is, strictly speaking, the moving image is not a continuous image. Accordingly, when fast moving images are displayed, residual images are readily generated in display. In particular, in a liquid crystal display device, each pixel maintains display from when a data signal is input to the pixel to when the next data signal is input to the pixel; therefore, residual images tend to be apparent. In Patent Document 1, a technique to reduce residual images (referred to as "double-frame rate driving" in general) is disclosed. Specifically, in Patent Document 1, the following technique is disclosed: an image for interpolation is formed between two images displayed sequentially, and the image is inserted between two images displayed sequentially, so that residual images are reduced.

REFERENCE

Patent Document

Japanese Published Patent Application No. H04-302289

DISCLOSURE OF INVENTION

It can be said that the above technique is a technique for increasing the number of data signals input to each pixel per unit time. Therefore, in order to apply this technique to a liquid crystal display device, a signal line supplying data signals to each pixel needs to operate at high speed. However, there is a possibility that parasitic capacitance is generated between the signal line extending to the pixel portion and another wiring extending to the pixel portion, and the parasitic capacitance prevents high speed operation of the signal line.

Thus, an object of one embodiment of the present invention is to reduce parasitic capacitance of a signal line included in a liquid crystal display device.

In a liquid crystal display device of one embodiment of the present invention, a transistor including an oxide semiconductor layer is used as a transistor provided in each pixel. Note that the oxide semiconductor layer is an oxide semiconductor layer which is highly purified by thoroughly removing impurities (hydrogen, water, or the like) which become electron suppliers (donors). The high-purified oxide semiconductor layer has extremely few (close to zero) carriers due to hydrogen, oxygen deficiency, or the like, and the carrier density is lower than $1\times10^{12}/cm^3$ or lower than $1\times10^{11}/cm^3$. In other words, the carrier density of the oxide semiconductor layer resulting from hydrogen, oxygen deficiency, or the like is reduced to close to zero as possible. Since the number of the carriers due to hydrogen, oxygen deficiency, or the like in the oxide semiconductor layer is extremely small, the leakage current (off-state current) of the transistor can be reduced when the transistor is off.

Thus, a voltage applied to the liquid crystal element can be held without providing a capacitor in each pixel. Further, a capacitor wiring extending to the pixel portion of the liquid crystal display device can be eliminated. Therefore, in the liquid crystal display device of one embodiment of the present invention, parasitic capacitance generated in a region where a signal line and the capacitor wiring intersect with each other does not exist. In contrast, in a conventional liquid crystal display device, parasitic capacitance is generated in a region where a signal line and a scan line intersect with each other and a region where the signal line and a capacitor wiring intersect with each other. That is, parasitic capacitance of the signal line can be reduced.

Specifically, one embodiment of the present invention is a liquid crystal display device. The liquid crystal display device includes: a first scan line and a second scan line arranged in parallel or substantially parallel to each other; a first signal line and a second signal line arranged perpendicularly or a substantially perpendicularly to the first scan line and the second scan line; and a transistor including an oxide semiconductor layer, in which a gate is electrically connected to the first scan line, one of a source and a drain is electrically connected to the first signal line, and the other of the source and the drain is electrically connected to a pixel electrode layer. The pixel electrode layer is provided in a region surrounded by the first scan line, the second scan line, the first signal line, and the second signal line. The first signal line and the second signal line intersect with the first scan line and the second scan line with an insulating layer provided over the first scan line and the second scan line interposed therebetween. An upper surface of the first signal line has a convex shape in a first region where the first signal line intersects with the first scan line and in a second region where the first signal line intersects with the second scan line, and has a planar shape or a substantially planar shape in a region between the first region and the second region. In other words, the whole of the upper surface of the first signal line exists coplanarly or substantially coplanarly in the whole region between the first region and the second region.

In the liquid crystal display device of one embodiment of the present invention, a transistor including an oxide semiconductor layer is used as the transistor provided in each pixel. Thus, a capacitor provided in each pixel can be eliminated. Specifically, even when the liquid crystal display device has a resolution of 60 ppi or more, a voltage applied to the liquid crystal element can be held without providing a capacitor in each pixel. Accordingly, the aperture ratio of each pixel can be improved. Further, a capacitor wiring extending to the pixel portion of the liquid crystal display device can be eliminated. That is, the liquid crystal display device is a liquid crystal display device in which parasitic capacitance of the signal line is reduced. Accordingly, in a liquid crystal display device of one embodiment of the present invention, a driving frequency of a signal line can be increased as compared to that of a signal line in a conventional liquid crystal display device. In other words, a liquid crystal display device of one embodiment of the present invention is preferable as a liquid crystal display device which is driven at a double-frame rate or a higher rate than the double-frame rate.

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the description of the embodiment below.

(Structure Example of Pixel)

First, an example of a structure of a pixel included in a liquid crystal display device of one embodiment of the present invention is described with reference to FIGS. 1A to 1C. Specifically, an example of a structure of a pixel in a liquid crystal display device having a structure in which a liquid crystal material is interposed between one substrate provided with a pixel electrode and the other substrate provided with a counter electrode (a liquid crystal display device in which a vertical electric field is applied to a liquid crystal material) is described with reference to FIGS. 1A to 1C.

Figure 1A:
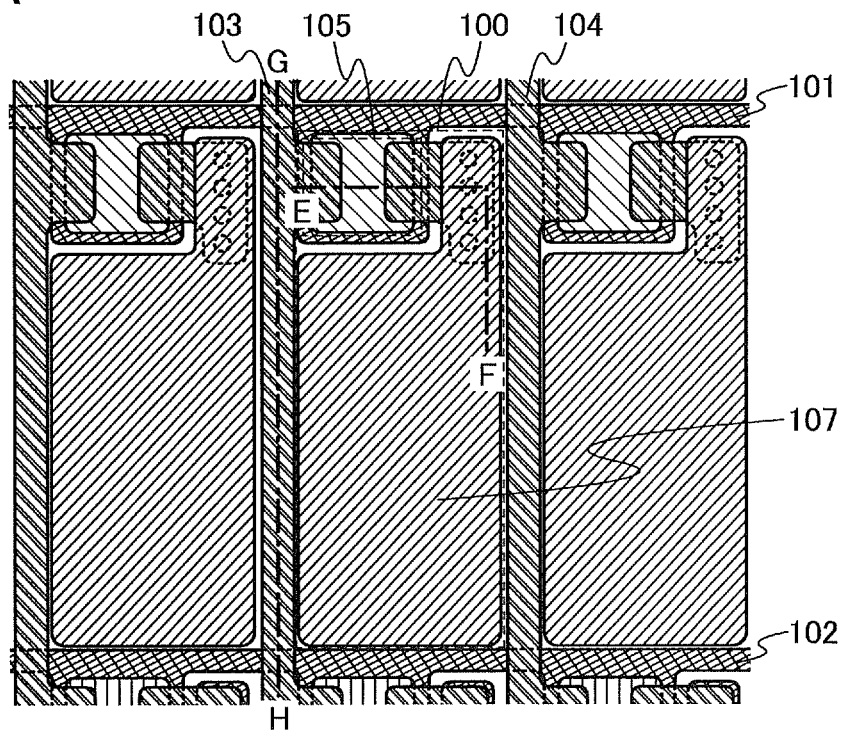
FIGS. 1A to 1C are a top view and cross-sectional views illustrating an example of a structure of a pixel of a liquid crystal display device.
Figure 13A:
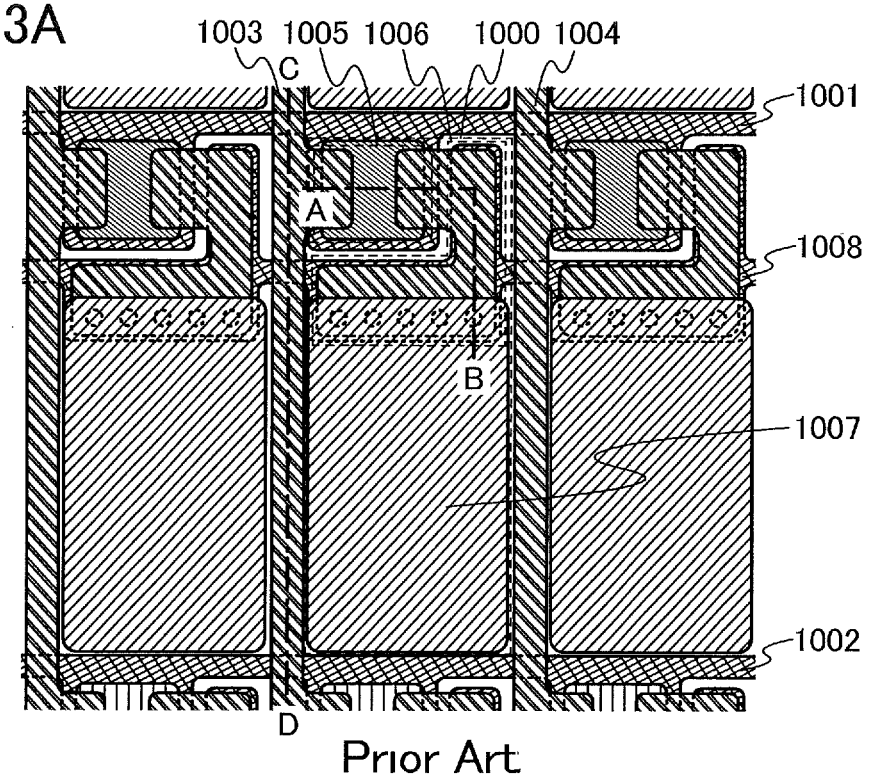
FIGS. 13A to 13C are a top view and cross-sectional views illustrating an example of a structure of a pixel of a liquid crystal display device.
Figure 13B:
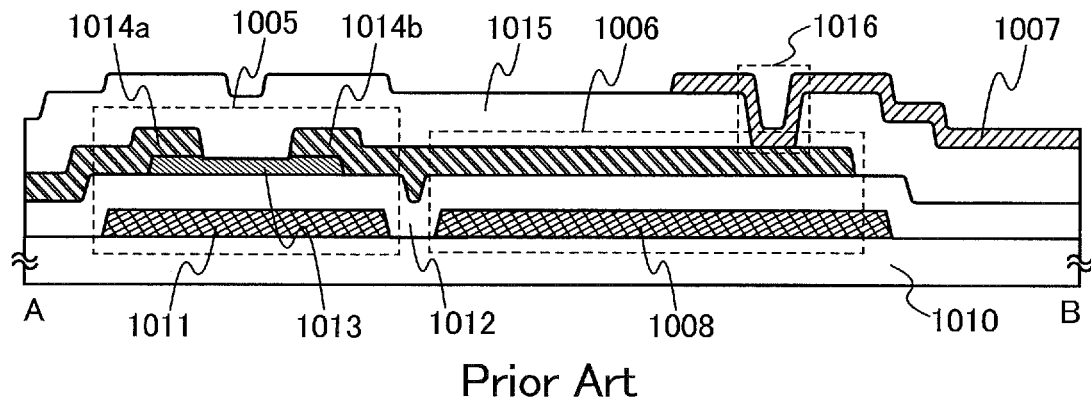
Figure 13C:
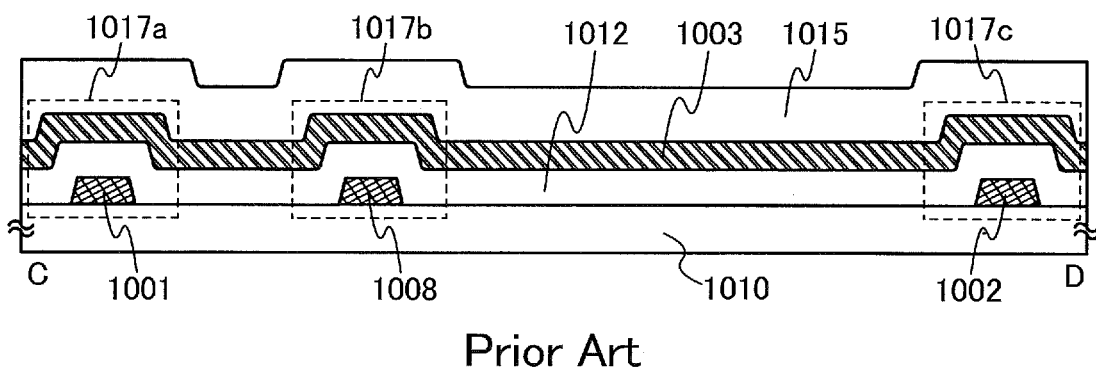

FIG. 1A is a top view of the pixel. Note that FIG. 1A is a diagram in which parts (a liquid crystal layer, the counter electrode, and the like) of the liquid crystal element are omitted (a so-called active matrix substrate is illustrated). A pixel 100 illustrated in FIG. 1A is provided in a region surrounded by a scan line 101 and a scan line 102 which are arranged in parallel or substantially parallel to each other and a signal line 103 and a signal line 104 which are arranged perpendicularly or substantially perpendicularly to the scan lines 101 and 102. Further, a transistor 105 and a pixel electrode layer 107 are provided in the pixel 100. In other words, the pixel 100 illustrated in FIG. 1A has a structure in which a component relating to the capacitor 1006 is omitted from the pixel 1000 illustrated in FIG. 13A.

Figure 1B:
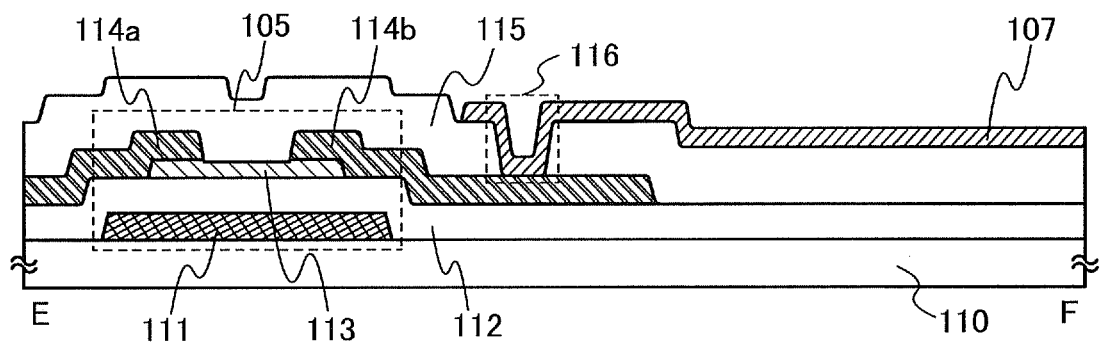

FIG. 1B is a cross-sectional view taken along line E-F in FIG. 1A. The transistor 105 includes: a gate layer 111 provided over a substrate 110; a gate insulating layer 112 provided over the gate layer 111; an oxide semiconductor layer 113 provided over the gate insulating layer 112; one of a source layer and a drain layer 114a provided over one end of the oxide semiconductor layer 113; and the other of the source layer and the drain layer 114b over the other end of the oxide semiconductor layer 113. Note that in the transistor 105 illustrated in FIGS. 1A and 1B, a projection of the scan line 101 is used as a gate and a projection of the signal line 103 is used as one of a source and a drain. Thus, in the transistor 105 illustrated in FIGS. 1A and 1B, the gate can be expressed as part of the scan line 101 and the one of the source and the drain can be expressed as part of the signal line 103. The other of the source layer and the drain layer 114b is electrically connected to the pixel electrode layer 107 in a contact hole 116 formed in an insulating layer 115 provided over the transistor 105.

Figure 1C:
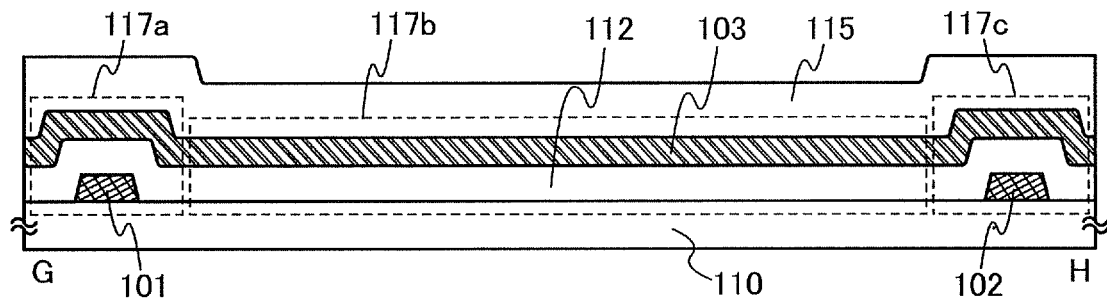

FIG. 1C is a cross-sectional view taken along line G-H in FIG. 1A. The signal line 103 intersects with the scan line 101 and the scan line 102 in a region 117a and a region 117c respectively with an insulating layer (the gate insulating layer 112) interposed therebetween. Therefore, an upper surface of the signal line 103 has a convex shape in the regions 117a and 117c. In addition, an upper surface of the signal line 103 has a planar shape or a substantially planar shape in a region 117b between the region 117a and the region 117c. In other words, the upper surface of the signal line 103 exists coplanarly or substantially coplanarly in the whole region 117b between the region 117a and the region 117c. This is because a capacitor wiring is not provided in the liquid crystal display device including the pixel 100. Note that it is apparent that the signal line 104 also has the same upper surface shape as the signal line 103.

As described above, the transistor 105 illustrated in FIGS. 1A to 1C includes the oxide semiconductor layer 113 as a semiconductor layer. As an oxide semiconductor used for the oxide semiconductor layer 113, an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which is a three-component metal oxide; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which is a two-component metal oxide; or an In—O-based oxide semiconductor, a Sn—O-based oxide semiconductor, or a Zn—O-based oxide semiconductor which is a one-component metal oxide can be used. Further, $SiO_2$ may be contained in the above oxide semiconductors. Here, for example, an In—Ga—Zn—O-based oxide semiconductor is an oxide including at least In, Ga, and Zn, and there is no particular limitation on the composition ratio thereof. Further, the In—Ga—Zn—O-based oxide semiconductor may contain an element other than In, Ga, and Zn.

For the oxide semiconductor layer 113, a thin film, represented by the chemical formula, $InMO_3(ZnO)_m(m>0)$ can be used. Here, M represents one or more metal elements selected from Ga, Al, Mn, and Co. For example, M can be Ga, Ga and Al, Ga and Mn, Ga and Co, or the like.

In order to suppress variation in electrical characteristics, the above-described oxide semiconductor is highly purified to exist in electrically i-type (intrinsic) by intentionally removing impurities such as hydrogen, moisture, a hydroxyl group, or a hydride (also referred to as a hydrogen compound) which is a factor of the variation.

Therefore, it is preferable that the oxide semiconductor contain as little hydrogen as possible. Further, the highly purified oxide semiconductor has very few (close to zero) carriers which are derived from hydrogen, oxygen deficiency, and the like and the carrier density is less than $1\times10^{12}/cm^3$ or than $1\times10^{11}/cm^3$. In other words, the density of carriers derived from hydrogen, oxygen deficiency, and the like in the oxide semiconductor layer is made as close to zero as possible. Since the oxide semiconductor layer has very few carriers derived from hydrogen, oxygen deficiency, and the like, the amount of leakage current (off-state current) can be small when the transistor is off. It is preferred that the amount of off-state current is small as possible. In the transistor including the above oxide semiconductor for a semiconductor layer, the current per micrometer of the channel width (W) has a value of 100 zA/μm (zeptoampere) or less, 10 zA/μm or less, or 1 zA/μm or less. Furthermore, because there is no pn junction and no hot carrier degradation, electrical characteristics of the transistor are not adversely affected thereby.

The oxide semiconductor which is highly purified by throughout removing hydrogen contained in the oxide semiconductor layer as described above is used in a channel formation region of a transistor, whereby the transistor with an extremely small amount of off-state current can be obtained. In other words, the circuit can be designed with the oxide semiconductor layer that can be regarded as an insulator when the transistor is off. On the other hand, when the transistor is on, the current supply capability of the oxide semiconductor layer is expected to be higher than the current supply capability of a semiconductor layer formed of amorphous silicon.

As the substrate 110, a glass substrate made of barium borosilicate glass, aluminoborosilicate glass, or the like can be used.

In the transistor 105, an insulating film serving as a base film may be provided between the substrate 110 and the gate layer 111. The base film has a function of preventing diffusion of an impurity element from the substrate 110, and can be formed to have a single-layer structure or a stacked structure using one or more of a silicon nitride film, a silicon oxide film, a silicon nitride oxide film, and a silicon oxynitride film.

As the gate layer 111, an element selected from aluminum (Al), copper (Cu), titanium (Ti), tantalum (Ta), tungsten (W), molybdenum (Mo), chromium (Cr), neodymium (Nd), and scandium (Sc), an alloy containing any of these elements, or a nitride containing any of these elements can be used. A stacked structure of these materials can also be used.

As the gate insulating layer 112, an insulator such as a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer formed by a plasma CVD method, a sputtering method, or the like can be used. Alternatively, a stacked structure of these insulators may be used. For example, by a plasma CVD method, a silicon nitride layer ($SiN_y(y>0)$) with a thickness greater than or equal to 50 nm and less than or equal to 200 nm is formed as a first gate insulating layer, and a silicon oxide layer ($SiO_x(x>0)$) with a thickness greater than or equal to 5 nm and less than or equal to 300 nm can be stacked over the first gate insulating layer, as a second gate insulating layer.

As a material of the one of the source and drain layers 114a and the other of the source and drain layers 114b, an element selected from aluminum (Al), chromium (Cr), copper (Cu), tantalum (Ta), titanium (Ti), molybdenum (Mo), and tungsten (W), an alloy containing any of these elements, a nitride containing any of these elements can be used. A stacked structure of these materials can also be used. Alternatively, a structure may be employed in which a high-melting-point metal layer of titanium (Ti), molybdenum (Mo), tungsten (W), or the like is stacked over and/or below a metal layer of aluminum (Al), copper (Cu), or the like. In addition, heat resistance can be improved by using an aluminum alloy to which an element (Si, Nd, Sc, or the like) which prevents generation of a hillock or a whisker in an aluminum (Al) film is added.

Note that the one of the source and drain layers 114a is part of the signal line 103 in the above-described liquid crystal display device. Therefore, in terms of high-speed driving of the signal line 103, the source layer and the drain layer are preferably formed using a low-resistance conductive material so that a signal delay is suppressed. For example, the source layer and the drain layer are preferably formed of a low-resistance conductive material such as copper (Cu) or an alloy including copper (Cu) as a main structural element. Alternatively, the source layer and the drain layer have a stacked structure which includes a layer including copper (Cu) or an alloy including copper (Cu) as a main structural element.

A capacitor is not provided in the pixel 100 in the above liquid crystal display device. Therefore, in terms of holding of a data signal in the pixel 100, a metal nitride is preferably used as the source layer and the drain layer in order to suppress the flow of carriers to the oxide semiconductor layer. For example, a nitride such as titanium nitride or tungsten nitride is preferably used. Alternatively, a stacked structure can be employed in which a layer in contact with the oxide semiconductor layer is formed using a nitride such as titanium nitride or tungsten nitride, and another conductive layer is formed thereover. For example, a stacked structure of tungsten nitride and copper (Cu), or the like can be employed.

Alternatively, a conductive film to be the source and drain layers 114a and 114b (including a wiring layer formed using the same layer as these layers 114a and 114b) may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO), indium oxide-zinc oxide ($In_2O_3$—ZnO), or any of these metal oxide in which silicon oxide is contained can be used.

As the insulating layer 115, typically, an inorganic insulating film such as a silicon oxide film, a silicon oxynitride film, an aluminum oxide film, or an aluminum oxynitride film can be used.

As the insulating layer 115, an inorganic insulating film such as a silicon nitride film, an aluminum nitride film, a silicon nitride oxide film, or an aluminum nitride oxide film can be used.

A planarization insulating film may be formed over the insulating layer 115 in order to reduce surface roughness caused by the transistor 105. As the planarization insulating film, an organic material such as a polyimide, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

(Off-State Current of Transistor 105)

Next, results obtained by measurement of the off-state current of a transistor including a highly purified oxide semiconductor layer will be described.

Figure 2:
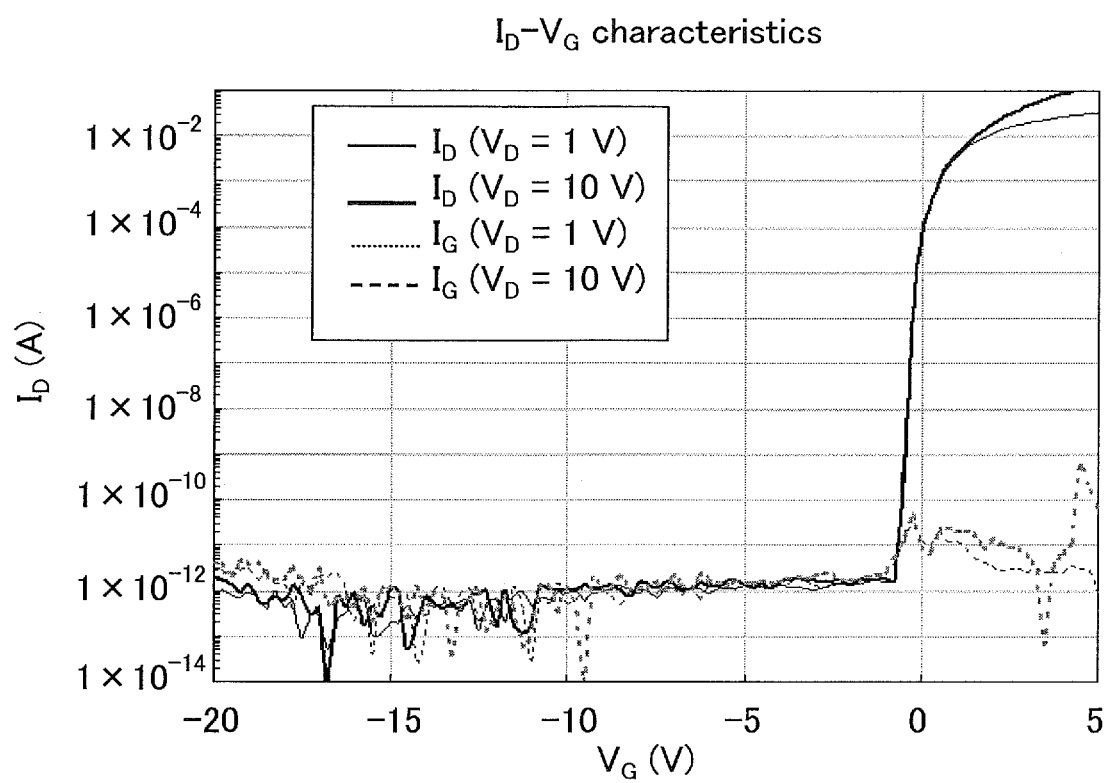
FIG. 2 is a graph showing characteristics of transistors.

First, a transistor with a sufficiently large channel width W of 1 m was prepared in consideration of the fact that the off-state current of a transistor including a highly purified oxide semiconductor layer is extremely small, and then the off-state current was measured. FIG. 2 shows the results obtained by measurement of the off-state current of a transistor with a channel width W of 1 m. In FIG. 2, the horizontal axis shows a gate voltage $V_G$ and the vertical axis shows a drain current $I_D$. In the case where the drain voltage $V_D$ is +1 V or +10 V and the gate voltage $V_G$ is within the range of −5 V to −20 V, the off-state current of the transistor was found to be smaller than or equal to $1 \times 10^{-12}$ A which is the detection limit. Moreover, it was found that the off-state current density of the transistor (per unit channel width (1 μm)) is lower than or equal to 1 aA/μm ($1 \times 10^{-18}$ A/μm).

Next will be described the results obtained by measurement of the off-state current of the transistor including a highly purified oxide semiconductor layer more accurately.

As described above, the off-state current of the transistor including a highly purified oxide semiconductor layer was found to be smaller than or equal to $1\times10^{-12}$ A, which is the detection limit of the measurement equipment. Here, the results obtained by more accurate measurement of the off-state current (the value smaller than or equal to the detection limit of measurement equipment in the above measurement), with the use of an element for characteristic evaluation, will be described.

First, the element for characteristic evaluation used in a method for measuring current will be described with reference to FIG. 3.

Figure 3:
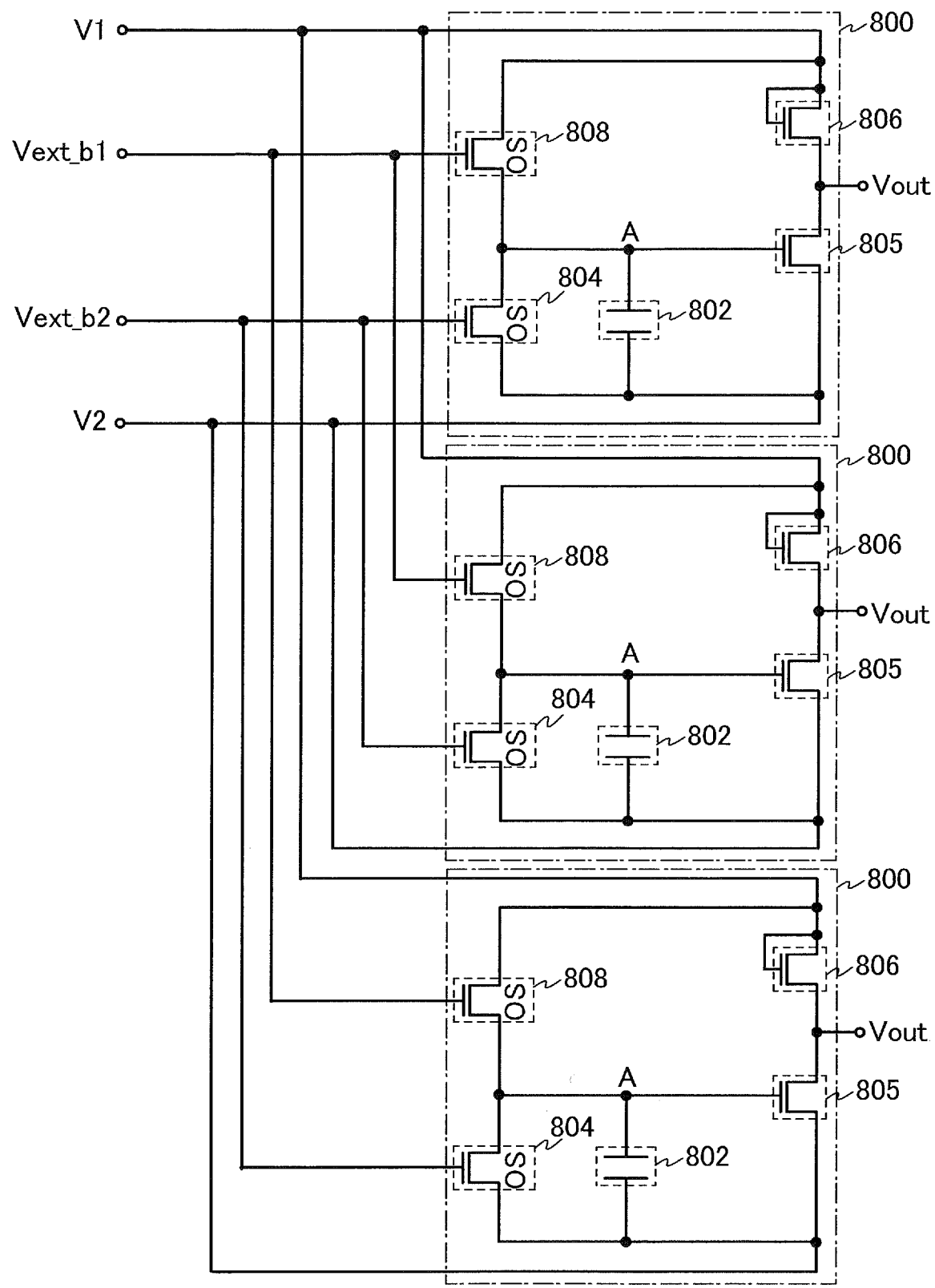
FIG. 3 is a circuit diagram for evaluating characteristics of a transistor.

In the element for characteristic evaluation in FIG. 3, three measurement systems 800 are connected in parallel. The measurement system 800 includes a capacitor 802, a transistor 804, a transistor 805, a transistor 806, and a transistor 808. The transistor including a highly purified oxide semiconductor layer is used as the transistors 804 and 808.

In the measurement system 800, one of a source and a drain of the transistor 804, one of terminals of the capacitor 802, and one of a source and a drain of the transistor 805 are connected to a power source (a power source for supplying V2). The other of the source and the drain of the transistor 804, one of a source and a drain of the transistor 808, the other of the terminals of the capacitor 802, and a gate of the transistor 805 are electrically connected to one another. The other of the source and the drain of the transistor 808, one of a source and a drain of the transistor 806, and a gate of the transistor 806 are electrically connected to a power source (a power source for supplying V1). The other of the source and the drain of the transistor 805, the other of the source and the drain of the transistor 806 are electrically connected to an output terminal.

A potential $V_{ext\_b2}$ for controlling an on state and an off state of the transistor 804 is supplied to a gate of the transistor 804. A potential $V_{ext\_b1}$ for controlling an on state and an off state of the transistor 808 is supplied to a gate of the transistor 808. A potential $V_{out}$ is output from the output terminal.

Next, a method for measuring current with the use of the element for characteristic evaluation will be described.

First, an initial period in which a potential difference is applied to measure the off-state current will be described briefly. In the initial period, the potential $V_{ext\_b1}$ for turning on the transistor 808 is input to the gate of the transistor 808, and a potential V1 is supplied to a node A that is a node electrically connected to the other of the source and the drain of the transistor 804 (i.e., the node electrically connected to the one of the source and the drain of the transistor 808, the other terminal of the capacitor 802, and the gate of the transistor 805). Here, the potential V1 is, for example, a high potential. The transistor 804 is turned off.

After that, the potential $V_{ext\_b1}$ for turning off the transistor 808 is input to the gate of the transistor 808 so that the transistor 808 is turned off. After the transistor 808 is turned off, the potential V1 is set to low. Still, the transistor 804 is off. The potential V2 is the same potential as the potential V1. Thus, the initial period is completed. In a state where the initial period is completed, a potential difference is generated between the node A and the one of the source and the drain of the transistor 804, and also, a potential difference is generated between the node A and the other of the source and the drain of the transistor 808. Therefore, charge flows slightly through the transistor 804 and the transistor 808. That is, the off-state current flows.

Next, a measurement period of the off-state current is briefly described. In the measurement period, the potential (V2) of the one of the source and the drain of the transistor 804 and the potential (V1) of the other of the source and the drain of the transistor 808 are set to low and fixed. On the other hand, the potential of the node A is not fixed (the node A is in a floating state) in the measurement period. Accordingly, charge flows through the transistors 804 and 808 and the amount of charge held in the node A varies over time. Further, as the amount of charge held in the node A varies, the potential of the node A varies. That is to say, the output potential $V_{out}$ of the output terminal also varies.

Figure 4:
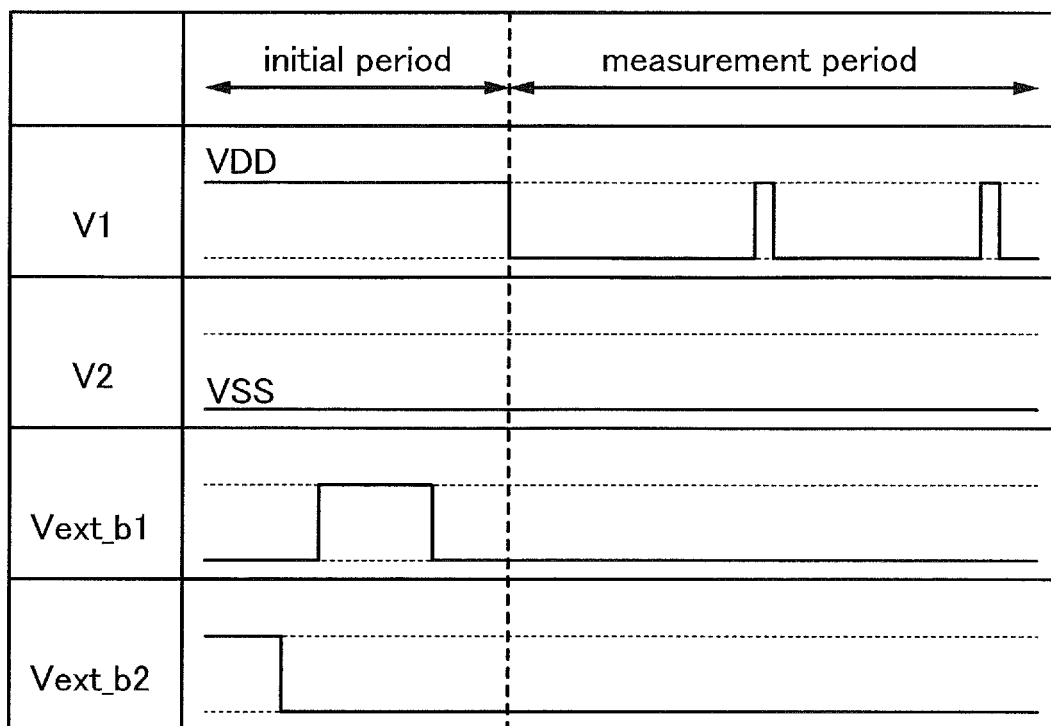
FIG. 4 is a timing chart for evaluating characteristics of a transistor.

FIG. 4 shows details of the relation (timing chart) between potentials in the initial period in which the potential difference is applied and in the following measurement period.

In the initial period, first, the potential $V_{ext\_b2}$ is set to a potential (high potential) at which the transistor 804 is turned on. Thus, the potential of the node A comes to be V2, that is, a low potential ($V_{SS}$). Note that a low potential ($V_{SS}$) is not necessarily supplied to the node A. After that, the potential $V_{ext\_b2}$ is set to a potential (low potential) at which the transistor 804 is turned off, whereby the transistor 804 is turned off. Next, the potential $V_{ext\_b1}$ is set to a potential (a high potential) at which the transistor 808 is turned on. Thus, the potential of the node A comes to be V1, that is, a high potential ($V_{DD}$). After that, the potential $V_{ext\_b1}$ is set to a potential at which the transistor 808 is turned off. Accordingly, the node A is brought into a floating state and the initial period is completed.

In the following measurement period, the potential V1 and the potential V2 are individually set to potentials at which charge flows to or from the node A. Here, the potential V1 and the potential V2 are low potentials ($V_{SS}$). Note that at the timing of measuring the output potential $V_{out}$, it is necessary to operate an output circuit; thus, V1 is set to a high potential ($V_{DD}$) temporarily in some cases. The period in which V1 is a high potential ($V_{DD}$) is set to be short so that the measurement is not influenced.

When the potential difference is generated and the measurement period is started as described above, the amount of charge hold in the node A varies over time, which varies the potential of the node A. This means that the potential of the gate of the transistor 805 varies and thus, the output potential $V_{out}$ of the output terminal also varies over time.

A method for calculating the off-state current on the basis of the obtained output potential $V_{out}$ is described below.

The relation between the potential $V_A$ of the node A and the output potential $V_{out}$ is obtained in advance before the off-state current is calculated. With this, the potential $V_A$ of the node A can be obtained using the output potential $V_{out}$. In accordance with the above relation, the potential $V_A$ of the node A can be expressed as a function of the output potential $V_{out}$ by the following equation.

$$V_A = F(V_{out}) \quad \text{[FORMULA 1]}$$

Charge $Q_A$ of the node A can be expressed by the following equation with the use of the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[FORMULA 2]}$$

Since a current $I_A$ of the node A is obtained by differentiating charge flowing to the node A (or charge flowing from the node A) with respect to time, the current $I_A$ of the node A is expressed by the following equation.

$$I_A \equiv \frac{\Delta Q_A}{\Delta t} = \frac{C_A \cdot \Delta F(Vout)}{\Delta t} \qquad \text{[FORMULA 3]}$$

In this manner, the current $I_A$ of the node A can be obtained from the capacitance $C_A$ connected to the node A and the output potential $V_{out}$ of the output terminal.

In accordance with the above method, it is possible to measure a leakage current (off-state current) which flows between a source and a drain of a transistor in an off state.

Here, the transistor 804 and the transistor 808 were formed using a highly purified oxide semiconductor with a channel length L of 10 μm and a channel width W of 50 μm. In addition, in the measurement systems 800 which are arranged in parallel, values of the capacitance of the capacitors 802 were 100 fF, 1 pF, and 3 pF, respectively.

Note that in the above-described measurement, $V_{DD}$ was 5 V and $V_{SS}$ was 0 V. In the measurement period, the potential V1 was basically set to $V_{SS}$ and set to $V_{DD}$ only in a period of 100 milliseconds every 10 seconds to 300 seconds, and $V_{out}$ was measured. Further, Δt which was used in calculation of a current I which flows through the element was about 30000 sec.

Figure 5:
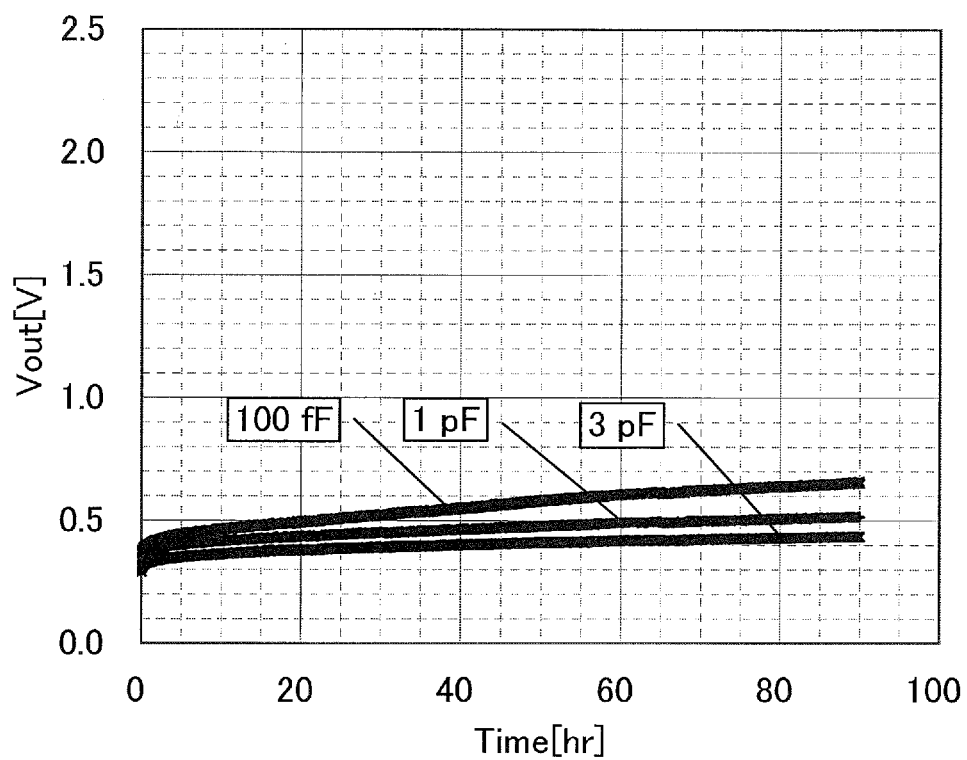
FIG. 5 is a graph showing characteristics of transistors.

FIG. 5 shows the relation between elapsed time Time in measuring the current and the output potential $V_{out}$. According to FIG. 5, the potential varies over time.

Figure 6:
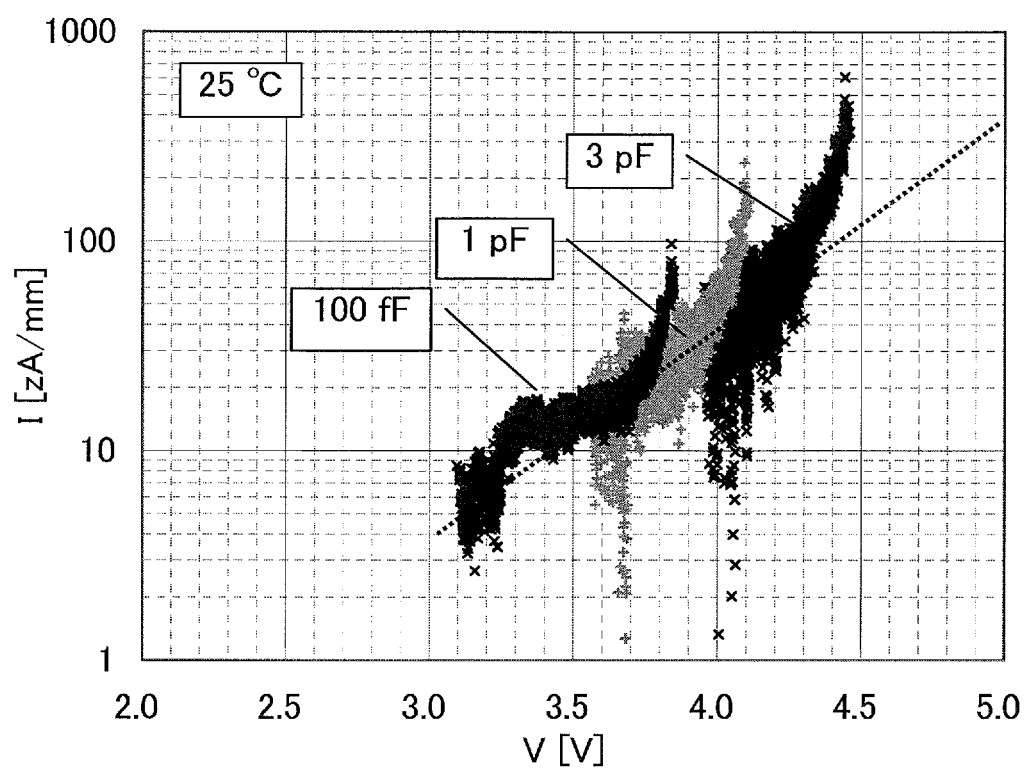
FIG. 6 is a graph showing characteristics of transistors.

FIG. 6 shows the off-state current at room temperature (25° C.) calculated based on the above current measurement. Note that FIG. 6 shows the relation between a source-drain voltage V of the transistor 804 or the transistor 808 and an off-state current I. According to FIG. 6, the off-state current was about 40 zA/μm under the condition that the source-drain voltage was 4 V. In addition, the off-state current was less than or equal to 10 zA/μm under the condition where the source-drain voltage was 3.1 V. Note that 1 zA represents $10^{-21}$ A.

Figure 7:
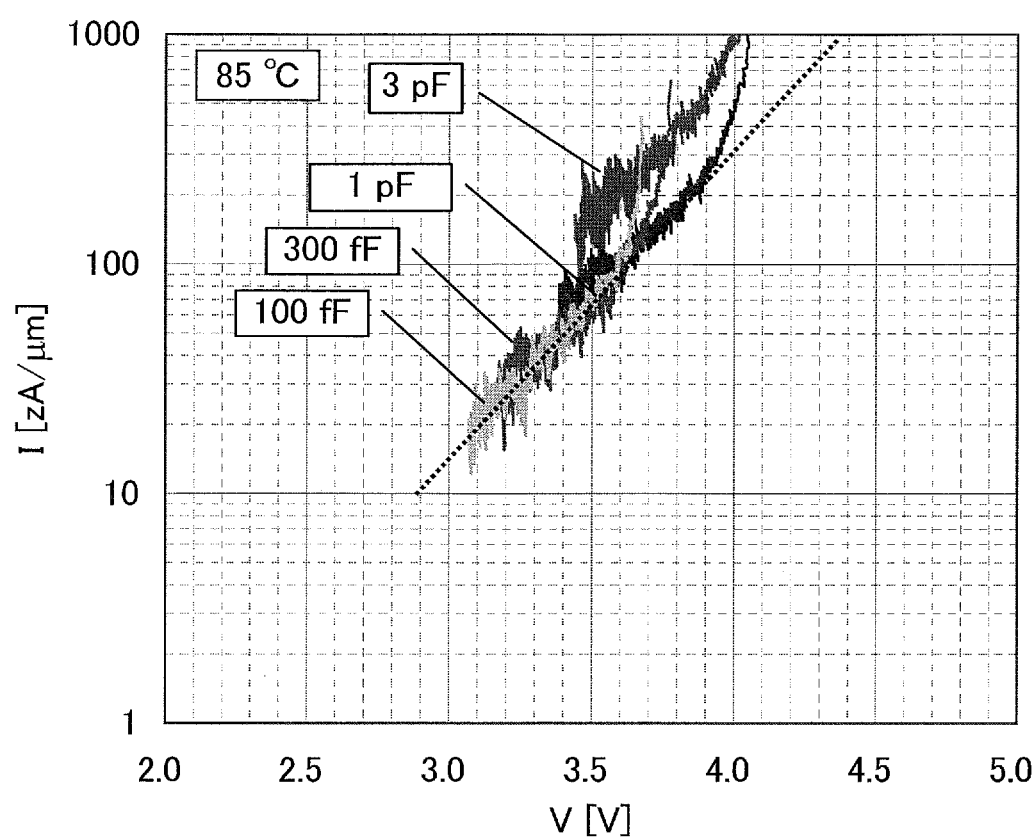
FIG. 7 is a graph showing characteristics of transistors.

FIG. 7 shows the off-state current in an environment at a temperature of 85° C., which was calculated based on the above current measurement. FIG. 7 shows the relation between a source-drain voltage V of the transistor 804 or the transistor 808 and an off-state current I in an environment at 85° C. According to FIG. 7, the off-state current was less than or equal to 100 zA/μm under the condition where the source-drain voltage was 3.1 V.

From the above results, it was confirmed that the off-state current can be sufficiently small in a transistor including a highly purified oxide semiconductor layer.

(Liquid Crystal Display Device Including Pixel 100)

In the liquid crystal display device disclosed in this specification, the transistor 105 including an oxide semiconductor layer is used as a transistor provided in each pixel. Since the off-state current of the transistor 105 including the oxide semiconductor layer is small, in the liquid crystal display device, a voltage applied to a liquid crystal element can be held without providing a capacitor in each pixel. Accordingly, the aperture ratio of each pixel can be improved. In addition, a capacitor wiring extending to a pixel portion of the liquid crystal display device can be eliminated. Therefore, parasitic capacitance due to the capacitor wiring does not exist in the liquid crystal display device disclosed in this specification. Specifically, there is no parasitic capacitance such as capacitance provided in a region where a signal line and a capacitor wiring intersect with each other with an insulating layer interposed therebetween. As a result, the driving frequency of the signal line can be improved in the liquid crystal display device disclosed in this specification. In other words, the liquid crystal display device disclosed in this specification is preferable as a liquid crystal display device which is driven at a double-frame rate or a higher rate than the double-frame rate.

In the case of performing driving at a double-frame rate or a higher rate than that the double-frame rate, the frequency of rewriting a data signal in each pixel is increased. That is, a period in which a voltage applied to a liquid crystal element in each pixel becomes shorter. Accordingly, variations in the voltage applied to the liquid crystal element (deterioration (change) in display in each pixel) can be further reduced. In addition, similar effects can be obtained in the case where the liquid crystal display device disclosed in this specification is driven by a field sequential system. In other words, it is preferable to employ field sequential driving for the liquid crystal display device disclosed in this specification.

In particular, the liquid crystal display device disclosed in this specification is highly effective when used as a large-sized liquid crystal display device (e.g., having 40 inches or more in size). As the size of a liquid crystal display device is increased, data signal delay or the like due to wiring resistance or the like easily occurs. In contrast, in the liquid crystal display device disclosed in this specification, parasitic capacitance generated in a signal line is reduced, so that data signal delay or the like can be reduced. Further, in the case where a small-sized liquid crystal display device and a large-sized one have the same number of pixels, each pixel included in the large-sized one is larger in size. This means that the capacitance of the liquid crystal element itself becomes large. Therefore, in addition to the use of the transistor 105 including an oxide semiconductor layer in each pixel, the large capacitance of the liquid crystal element itself contributes to reduction in the variation of the voltage applied to the liquid crystal element.

Moreover, the liquid crystal display device disclosed in this specification is highly effective when used as a liquid crystal display device having high definition (a large number of pixels) (e.g., a full high-definition (FHD) one and a one having a resolution of 2K4K or more). The number of wirings provided in a pixel portion is increased in accordance with higher definition (an increase in the number of pixels) of a liquid crystal display device, so that parasitic capacitance generated in the signal line is readily increased. In contrast, since a capacitor wiring is not provided in the liquid crystal display device disclosed in this specification, an increase in parasitic capacitance can be reduced. In addition, in the case where a liquid crystal display device which has a large number of pixels and a liquid crystal display device which has a small number of pixels have the same size, the wiring density in a pixel portion of the former device is increased. This means that the aperture ratio of each pixel is decreased. Moreover, in the liquid crystal display device disclosed in this specification, a capacitor is not provided in each pixel; therefore, a decrease in the aperture ratio can be suppressed.

In a conventional liquid crystal display device, holding characteristics of a data signal of each pixel have mainly determined by characteristics (the value of the off-state current) of a transistor provided therein. However, by applying the transistor 105 including a highly purified oxide semiconductor layer as a transistor provided in each pixel, the holding characteristics of the data signal of each pixel is mainly determined by characteristics of a liquid crystal element (a current flowing in a liquid crystal element). That is, in the liquid crystal display device disclosed in this specification, leakage of charge through the liquid crystal element has larger influence than leakage of charge through the transistor 105. Therefore, it is preferable that a substance having a high specific resistivity be used as the liquid crystal material included in the liquid crystal element. Specifically, in the liquid crystal display device disclosed in this specification, the specific resistivity of the liquid crystal material is preferably $1\times10^{12}$ Ω·cm or more, still preferably over $1\times10^{13}$ Ω·cm, still further preferably over $1\times10^{14}$ Ω·cm. In the case where a liquid crystal element is formed using the liquid crystal material, since there is a possibility of entry of impurities from an alignment film or a sealant, the resistivity of the liquid crystal element is preferably $1\times10^{11}$ Ω·cm or more, more preferably over $1\times10^{12}$ Ω·cm. Note that the value of the specific resistivity in this specification is defined as that measured at 20° C.

(Modified Example of Structure of Pixel)

A liquid crystal display device having the above-described structure is one embodiment of the present invention, and a liquid crystal display device different from the liquid crystal display device having the above-described structure in some points is included in the present invention.

Figure 8A:
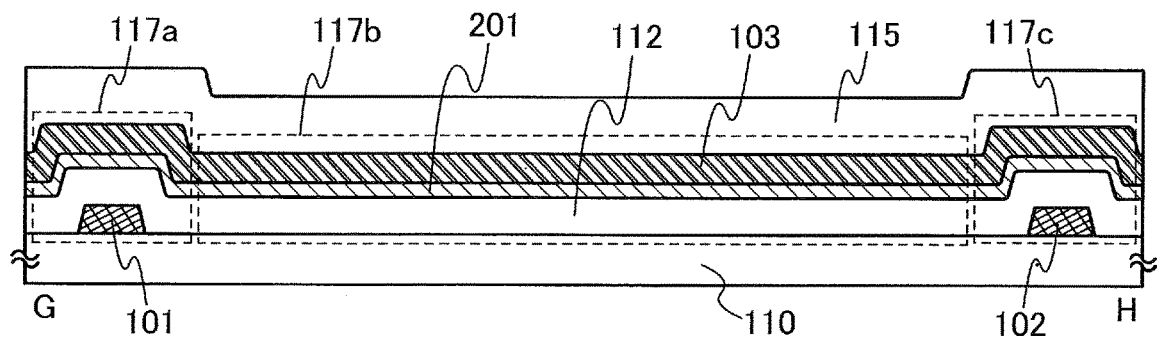
FIGS. 8A to 8C are cross-sectional views each illustrating an example of a structure of a pixel of a liquid crystal display device.

Although only the gate insulating layer 112 is provided between the signal line 103 and the scan line 101 and between the signal line 103 and the scan line 102 (see FIG. 1C) in the aforementioned liquid crystal display device, an oxide semiconductor layer 201 can be provided between the signal line 103 and the gate insulating layer 112 (see FIG. 8A). In other words, in a step for forming the oxide semiconductor layer 113 included in the transistor 105 (a photolithography step and an etching step), an oxide semiconductor layer can be left without being etched also in a region where the signal line 103 is to be formed later. Thus, by providing the oxide semiconductor layer 201 between the signal line 103 and the gate insulating layer 112, parasitic capacitance between the signal line 103 and the scan line 101 and between the signal line 103 and the scan line 102 can be further reduced.

Figure 8B:
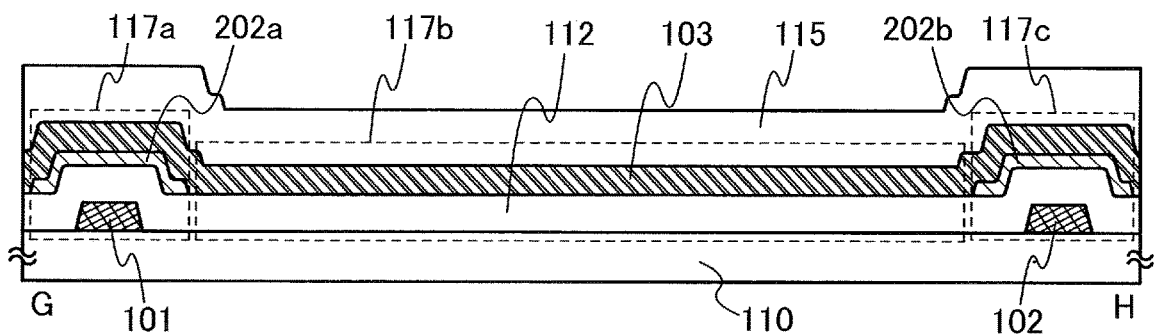
Figure 8C:
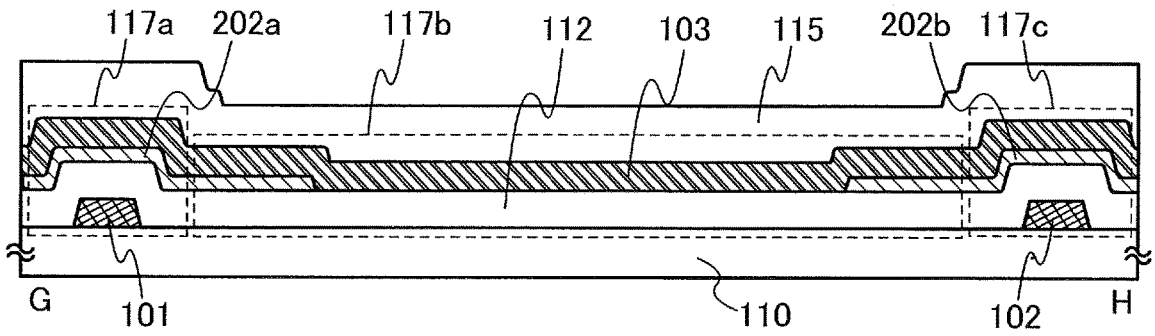

Further, an oxide semiconductor layer can be selectively provided between the signal line 103 and the gate insulating layer 112. For example, an oxide semiconductor layer 202a and an oxide semiconductor layer 202b can be selectively provided in the region 117a where the signal line 103 and the scan line 101 intersect with each other and in the region 117c where the signal line 103 and the scan line 102 intersect with each other, respectively (see FIG. 8B). The oxide semiconductor layers 202a and 202b can be selectively provided in part of the region 117b in addition to the regions 117a and 117c (see FIG. 8C). Note that a step occurs on the upper surface of the signal line 103 in the region 117b in this case due to the oxide semiconductor layer between the signal line 103 and the gate insulating layer 112; however, in this specification, the upper surface shape is regarded as a shape included in a substantially planar shape. In other words, the signal line 103 and the gate insulating layer 112 directly contact with each other in the whole region interposed between the steps caused by the scan line 101, the scan line 102, and the part of the oxide semiconductor layers 202a and 202b, and the whole of the upper surface of the signal line 103 exists coplanarly or substantially coplanarly in this region.

In the above-described liquid crystal display device, the channel-etched transistor 105 which is one kind of transistors having a bottom-gate structure (see FIG. 1B) is used as a transistor provided in each pixel; however, a transistor having another structure can be used. For example, a channel-stop transistor 210 which is one kind of transistors having a bottom-gate structure (see FIG. 9A) or a bottom-contact transistor 220 which is one kind of transistors having a bottom-gate structure (see FIG. 9B) can be used.

Figure 9A:
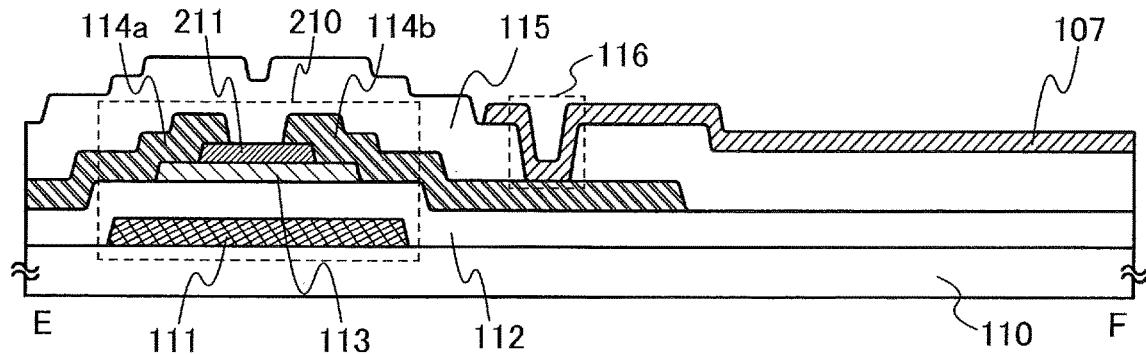
FIGS. 9A to 9C are cross-sectional views each illustrating an example of a structure of a pixel of a liquid crystal display device.

Specifically, the channel-stop transistor 210 illustrated in FIG. 9A includes: the gate layer 111 provided over the substrate 110; the gate insulating layer 112 provided over the gate layer 111; the oxide semiconductor layer 113 provided over the gate insulating layer 112; an insulating layer 211 which functions as a channel protective layer and is provided over a central portion of the oxide semiconductor layer 113; the one of the source and drain layers 114a provided over the one end of the oxide semiconductor layer 113 and one end of the insulating layer 211; and the other of the source and drain layers 114b provided over the other end of the oxide semiconductor layer 113 and the other end of the insulating layer 211. Note that the insulating layer 211 can be formed using an inorganic insulating film such as a silicon oxide film, a silicon oxynitride film, an aluminum oxide film, or an aluminum oxynitride film.

Figure 9B:
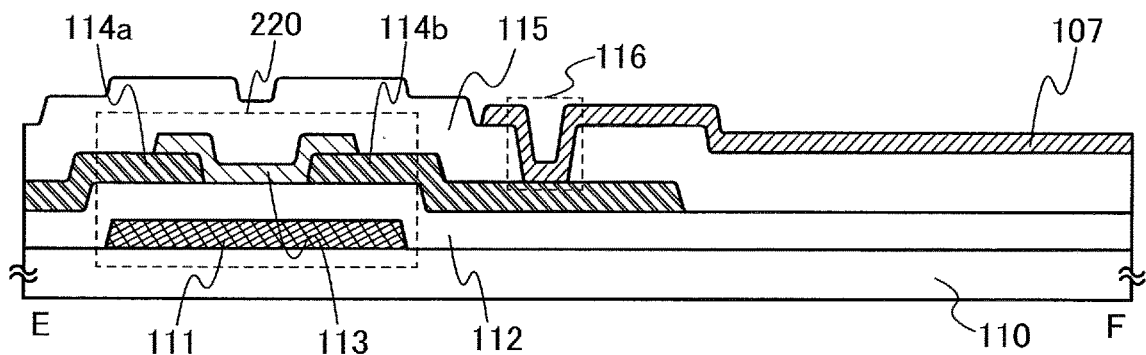

The bottom-contact transistor 220 illustrated in FIG. 9B includes: the gate layer 111 provided over the substrate 110; the gate insulating layer 112 provided over the gate layer 111; one of the source and drain layers 114a and the other of the source and drain layers 114b provided over the gate insulating layer 112; and the oxide semiconductor layer 113 provided over one end of the one of the source and drain layers 114a, one end of the other of the source and drain layers 114b, and the gate insulating layer 112.

Figure 9C:
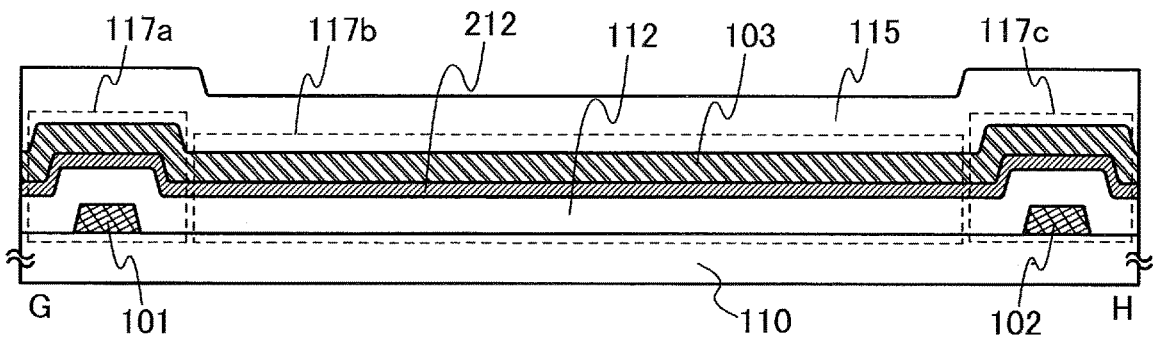

Further, in the case where a transistor provided in each pixel is the channel-stop transistor 210, an insulating layer 212 can be provided between the signal line 103 and the gate insulating layer 112 (see FIG. 9C). Note that the insulating layer 212 is an insulating layer formed using the same material as the insulating layer 211 which functions as a channel protective layer included in the transistor 210. Further, an oxide semiconductor layer can be provided between the gate insulating layer 112 and the insulating layer 212 (not illustrated). Note that the oxide semiconductor layer is an oxide semiconductor layer formed using the same material as the oxide semiconductor layer 113 included in the transistor 210. Furthermore, the oxide semiconductor layer and the insulating layer can be selectively provided only over the scan line 101 and the scan line 102 (not illustrated).

Figure 10A:
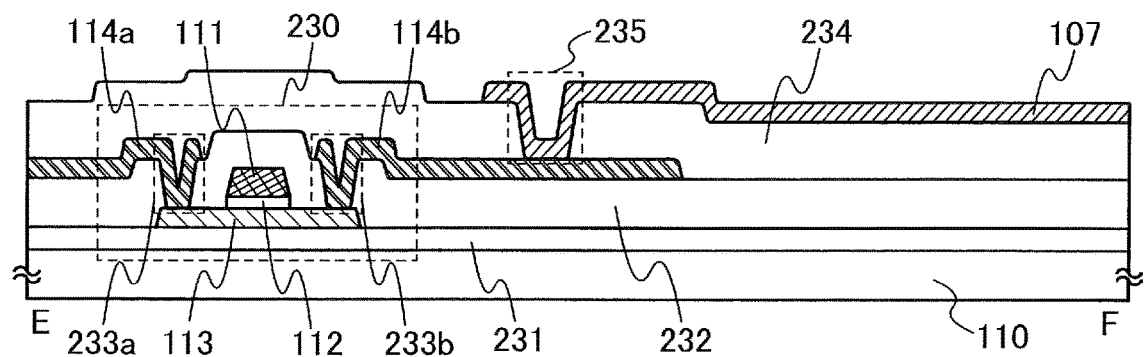
FIGS. 10A and 10B are cross-sectional views each illustrating an example of a structure of a pixel of a liquid crystal display device.
Figure 10B:
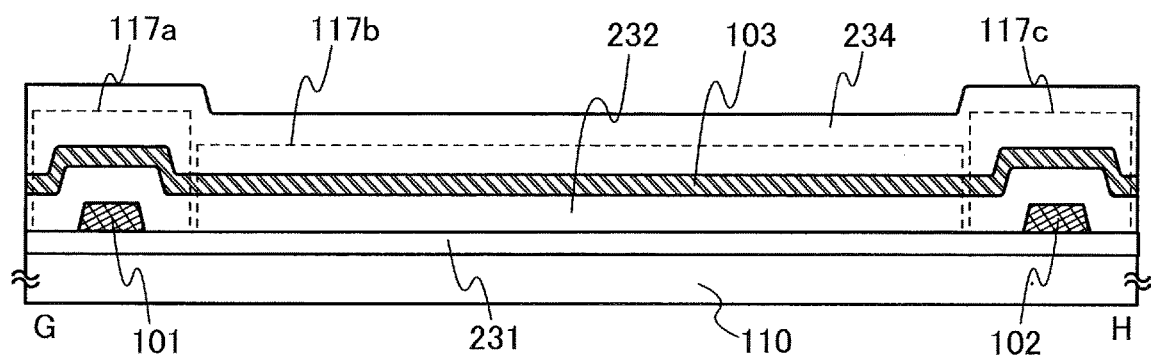

Alternatively, a top-gate transistor 230 (see FIG. 10A) can be used as the transistor 105. Specifically, the top-gate transistor 230 illustrated in FIG. 10A includes: a base insulating layer 231 provided over the substrate 110; the oxide semiconductor layer 113 provided over the base insulating layer 231; the gate insulating layer 112 provided over the oxide semiconductor layer 113; the gate layer 111 provided over the gate insulating layer 112; the one of the source and drain layers 114a which is in contact with the oxide semiconductor layer 113 in a contact hole 233a formed in an insulating layer 232 provided over the oxide semiconductor layer 113 and the gate layer 111; and the other of the source and drain layers 114b which is in contact with the oxide semiconductor layer 113 in a contact hole 233b formed in the insulating layer 232 provided over the oxide semiconductor layer 113 and the gate layer 111. The other of the source and drain layers 114b is electrically connected to the pixel electrode layer 107 in a contact hole 235 formed in an insulating layer 234 provided over the transistor 230. In this case, the signal line 103 intersects with the scan lines 101 and 102 with the insulating layer 232 interposed therebetween in the regions 117a and 117c (see FIG. 10B). Note that the base insulating layer 231 can be formed with a single-layer structure or a stacked structure using one or more of a silicon nitride film, a silicon oxide film, a silicon nitride oxide film, and a silicon oxynitride film. The insulating layer 232 can be formed with a single-layer structure or a stacked structure using one or more of inorganic insulators such as a silicon oxide film, a silicon nitride film, a silicon oxynitride film, a silicon nitride oxide film, an aluminum oxide film, an aluminum nitride film, an aluminum oxynitride film, an aluminum nitride oxide film, and a hafnium oxide film. Note that the insulating layer 234 can be formed using an inorganic insulating film similar to that of the insulating layer 232 or using an organic material such as a polyimide, an acrylic resin, or a benzocyclobutene-based resin.

Although one transistor is provided in each pixel in the above-described liquid crystal display device, two or more transistors can be provided in each pixel. For example, in the case where two transistors are provided in each pixel to solve a problem relating to the viewing angle of a vertical alignment (VA) mode liquid crystal display device, a transistor including an oxide semiconductor layer can be used as the two transistors. Here, the liquid crystal display device is regarded as a liquid crystal display device including two leak paths through the transistors in each pixel. Therefore, in a conventional liquid crystal display device, a voltage applied to a liquid crystal element is held by increasing the area of capacitors, for example, providing two capacitors in each pixel. That is, the voltage applied to the liquid crystal element is held with the aperture ratio sacrificed. In contrast, in a liquid crystal display device disclosed in this specification, leakage of charge through a transistor including an oxide semiconductor layer is significantly reduced, so that a capacitor itself can be eliminated. That is, the liquid crystal display device disclosed in this specification can maintain high aperture ratio even when a plurality of transistors is provided in each pixel.

(Specific Example of Method for Manufacturing Transistor)

As an example of a transistor which is provided in each pixel of the liquid crystal display device disclosed in this specification, a process for manufacturing a channel-etched transistor 410 which is one kind of transistors having a bottom-gate structure is described below with reference to FIGS. 11A to 11D. Although a single-gate transistor is illustrated here, a multi-gate transistor including a plurality of channel formation regions can be formed as needed.

A process for manufacturing the transistor 410 over a substrate 400 is described below with reference to FIGS. 11A to 11D.

First, a conductive film is formed over the substrate 400 having an insulating surface, and a first photolithography step is performed thereon, so that a gate layer 411 is formed. Note that a resist mask used in the process may be formed by an inkjet method. In the case of forming a resist mask by an inkjet method, the manufacturing cost can be reduced because a photomask is not used.

Although there is no particular limitation on a substrate which can be used as the substrate 400 having an insulating surface, it is necessary that the substrate have at least enough heat resistance to heat treatment to be performed later. For example, a glass substrate made of barium borosilicate glass, aluminoborosilicate glass, or the like can be used. In the case where a glass substrate is used and the temperature at which the heat treatment performed later is high, a glass substrate whose strain point is higher than or equal to 730° C. is preferably used.

An insulating layer serving as a base layer may be provided between the substrate 400 and the gate layer 411. The base layer has a function of preventing diffusion of an impurity element from the substrate 400, and can be formed with a single-layer structure or a stacked structure using one or more of a silicon nitride film, a silicon oxide film, a silicon nitride oxide film, and a silicon oxynitride film.

The gate layer 411 can be formed to have a single-layer structure or a stacked structure using a metal such as molybdenum, titanium, chromium, tantalum, tungsten, aluminum, copper, neodymium, or scandium or an alloy which contains any of these metals as its main component.

As a two-layer structure of the gate layer 411, for example, the following structure is preferable: a structure in which a molybdenum layer is stacked over an aluminum layer, a structure in which a molybdenum layer is stacked over a copper layer, a structure in which a titanium nitride layer or a tantalum nitride layer is stacked over a copper layer, or a structure in which a titanium nitride layer and a molybdenum layer are stacked. As a three-layer structure, a three-layer structure of a tungsten layer or a tungsten nitride layer, a layer of an alloy of aluminum and silicon or an alloy of aluminum and titanium, and a titanium nitride layer or a titanium layer is preferable.

Then, a gate insulating layer 402 is formed over the gate layer 411.

The gate insulating layer 402 can be formed to have a single-layer or stacked structure using one or more of a silicon oxide layer, a silicon nitride layer, a silicon oxynitride layer, a silicon nitride oxide layer, and an aluminum oxide layer by a plasma CVD method, a sputtering method, or the like. For example, a silicon oxynitride layer may be formed by a plasma CVD method using silane ($SiH_4$), oxygen, and nitrogen as a deposition gas. Furthermore, a high-k material such as hafnium oxide ($HfO_x$) or tantalum oxide ($TaO_x$) can be used as the gate insulating layer 402. The gate insulating layer 402 is formed to a thickness of 100 nm to 500 nm inclusive; in the case where the gate insulating layer 402 is formed with a stacked structure, for example, a first gate insulating layer with a thickness of 50 nm to 200 nm inclusive and a second gate insulating layer with a thickness of 5 nm to 300 nm inclusive are stacked.

Here, a silicon oxynitride layer is formed as the gate insulating layer 402 by a plasma CVD method.

As the gate insulating layer 402, a silicon oxynitride layer may be formed with a high density plasma apparatus. Here, the high-density plasma apparatus refers to an apparatus which can realize a plasma density higher than or equal to $1 \times 10^{11}/cm^3$. For example, plasma is generated by application of a microwave power of 3 kW to 6 kW so that an insulating layer is formed.

As a source gas, silane ($SiH_4$), nitrous oxide ($N_2O$), and a rare gas are introduced into a chamber. Then, high-density plasma is generated at a pressure of 10 Pa to 30 Pa, and the insulating layer is formed over the substrate having an insulating surface, such as a glass substrate. After that, the supply of silane ($SiH_4$) is stopped, and plasma treatment may be performed on a surface of the insulating layer by introducing nitrous oxide ($N_2O$) and a rare gas without exposure of the insulating layer to the air. The insulating layer formed through the above process procedure contributes to high reliability of the transistor even it has a small thickness.

In forming the gate insulating layer 402, the flow ratio of silane ($SiH_4$) to nitrous oxide ($N_2O$) which are introduced into the chamber is in the range of 1:10 to 1:200. As a rare gas which is introduced into the chamber, helium, argon, krypton, xenon, or the like can be used. In particular, argon, which is inexpensive, is preferably used.

Since the insulating layer formed using the high-density plasma apparatus can have a uniform thickness, the insulating layer has excellent ability to cover a step. Further, with the high-density plasma apparatus, the thickness of a thin insulating film can be controlled precisely.

The insulating layer formed through the above process procedure is greatly different from the insulating layer formed using a conventional parallel plate plasma CVD apparatus. The etching rate of the insulating film formed through the above process procedure is lower than that of the insulating film formed using the conventional parallel plate plasma CVD apparatus by 10% or more or 20% or more in the case where the etching rates with the same etchant are compared to each other. Thus, it can be said that the insulating layer formed using the high-density plasma apparatus is a dense film.

The oxide semiconductor which becomes i-type or becomes substantially i-type (an oxide semiconductor which is highly purified) in a later step is extremely sensitive to an interface state or an interface charge; therefore, an interface with the gate insulating layer plays an important role. For that reason, the gate insulating layer that is to be in contact with a highly purified oxide semiconductor needs to have a high quality. Therefore, a high-density plasma CVD apparatus with use of microwaves (2.45 GHz) is preferably employed since a dense and high-quality insulating film having high withstand voltage can be formed. When the highly purified oxide semiconductor and the high-quality gate insulating layer are in contact with each other, the interface state density can be reduced and favorable interface characteristics can be obtained. It is important that the gate insulating layer have lower interface state density with an oxide semiconductor and a favorable interface as well as having favorable film quality as a gate insulating layer.

Then, an oxide semiconductor film 430 is formed to a thickness of 2 nm to 200 nm inclusive over the gate insulating layer 402. Note that before the oxide semiconductor film 430 is formed by a sputtering method, powdery substances (also referred to as particles or dust) which are attached on a surface of the gate insulating layer 402 are preferably removed by reverse sputtering in which an argon gas is introduced and plasma is generated. The reverse sputtering refers to a method in which, without application of a voltage to a target side, an RF power source is used for application of a voltage to the substrate side in an argon atmosphere so that plasma is generated in the vicinity of the substrate to modify a surface of the substrate. Note that instead of an argon atmosphere, a nitrogen atmosphere, a helium atmosphere, an oxygen atmosphere, or the like may be used.

Figure 11A:
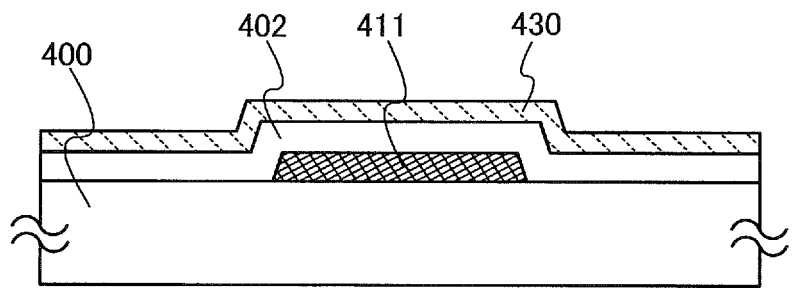
FIGS. 11A to 11D are cross-sectional views illustrating an example of a manufacturing process of a transistor.
Figure 11B:
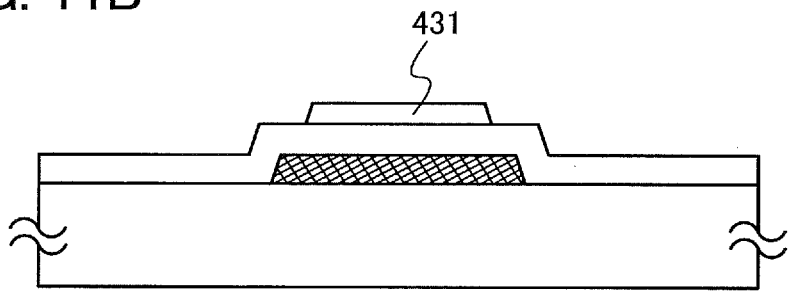
Figure 11C:
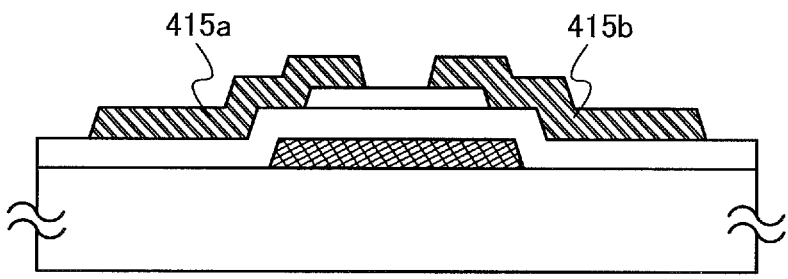
Figure 11D:
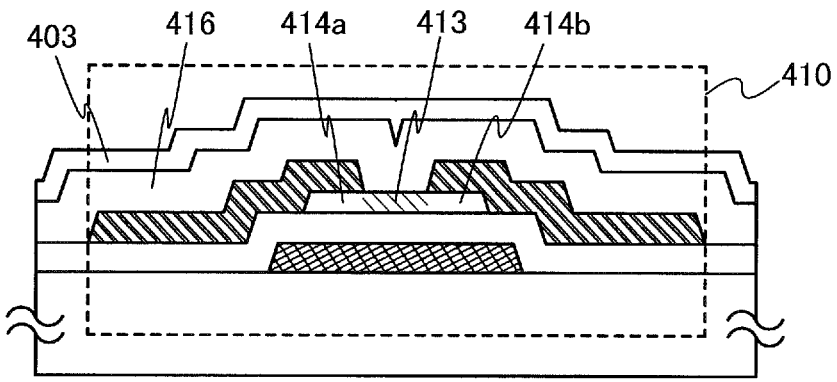

As the oxide semiconductor film 430, an In—Ga—Zn—O-based oxide semiconductor film, an In—Sn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. Here, the oxide semiconductor film 430 is formed by a sputtering method with the use of an In—Ga—Zn—O-based metal oxide target. A cross-sectional view at this stage is illustrated in FIG. 11A. Alternatively, the oxide semiconductor film 430 can be formed by a sputtering method in a rare gas (typically argon) atmosphere, an oxygen atmosphere, or a mixed atmosphere of a rare gas (typically argon) and oxygen. When a sputtering method is employed, deposition may be performed using a target containing $SiO_2$ at 2 wt % to 10 wt % inclusive to allow SiOx (x>0) which inhibits crystallization to be contained in the oxide semiconductor film 430, so that crystallization can be suppressed in the heat treatment for dehydration or dehydrogenation in a later step.

Here, film deposition is performed using a metal oxide target containing In, Ga, and Zn ($In_2O_3$:$Ga_2O_3$:ZnO=1:1:1 [mol], and In:Ga:Zn=1:1:0.5 [atom]). The deposition condition is set as follows: the distance between the substrate and the target is 100 mm; the pressure is 0.2 Pa; the direct current (DC) power is 0.5 kW; and the atmosphere is a mixed atmosphere of argon and oxygen (argon:oxygen=30 sccm: 20 sccm and the oxygen flow rate is 40%). Note that a pulse direct current (DC) power source is preferable because powder substances generated in deposition can be reduced and the film thickness can be made uniform. The In—Ga—Zn—O-based film is formed to a thickness of 2 nm to 200 nm inclusive. Here, as the oxide semiconductor film, a 20-nm-thick In—Ga—Zn—O-based film is formed by a sputtering method with the use of an In—Ga—Zn—O-based metal oxide target. As the metal oxide target containing In, Ga, and Zn, a metal oxide target having a composition ratio of In:Ga:Zn=1:1:1 [atom] or a target having a composition ratio of In:Ga:Zn=1:1:2 [atom] can also be used.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

There is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus for an ECR sputtering in which plasma generated in the presence of microwaves is applied instead of glow discharge.

Furthermore, as a deposition method by sputtering, there are also a reactive sputtering method in which a target substance and a sputtering gas are chemically reacted with each other during deposition to form a thin film of a compound thereof, and a bias sputtering in which a voltage is also applied to a substrate during deposition.

Then, the oxide semiconductor film 430 is processed into an island-shaped oxide semiconductor layer in a second photolithography step. Note that a resist mask used in the process may be formed by an inkjet method. Formation of the resist mask by an inkjet method needs no photomask; thus, manufacturing cost can be reduced.

Next, dehydration or dehydrogenation of the oxide semiconductor layer is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is cooled without exposure to the air in order to avoid entry of water and hydrogen thereto; thus, an oxide semiconductor layer 431 is obtained (see FIG. 11B).

Note that a heat treatment apparatus is not limited to an electrical furnace, and may include a device for heating an object to be processed by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed. With GRTA, high-temperature heat treatment for a short period can be achieved.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

The first heat treatment of the oxide semiconductor layer can be performed on the oxide semiconductor film 430 before being processed into the island-shaped oxide semiconductor layer. In that case, after the first heat treatment, the substrate is extracted from the heat treatment apparatus, and then the second photolithography step is performed.

The heat treatment for dehydration or dehydrogenation of the oxide semiconductor layer may be performed at any of the following timings after the oxide semiconductor layer is formed; after a source electrode layer and a drain electrode layer are formed over the oxide semiconductor layer; and after a protective insulating film is formed over the source electrode layer and the drain electrode layer.

In the case where an opening portion is formed in the gate insulating layer 402, the step of forming the opening portion may be performed either before or after the oxide semiconductor film 430 is subjected to dehydration or dehydrogenation treatment.

Note that the etching of the oxide semiconductor film 430 is not limited to wet etching, and dry etching may also be used.

As the etching gas for dry etching, a gas including chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate reactive ion etching (RIE) method or an inductively coupled plasma (ICP) etching method can be used. In order to etch the films into desired shapes, the etching conditions (the amount of electric power applied to a coil-shaped electrode, the amount of electric power applied to an electrode on a substrate side, the temperature of the electrode on the substrate side, and the like) are adjusted as appropriate.

As an etchant used for wet etching, a mixed solution of phosphoric acid, acetic acid, and nitric acid, or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, a metal conductive film is formed over the gate insulating layer 402 and the oxide semiconductor layer 431. The metal conductive film may be formed by a sputtering method or a vacuum evaporation method. As a material of the metal conductive film, an element selected from aluminum (Al), chromium (Cr), copper (Cu), tantalum (Ta), titanium (Ti), molybdenum (Mo), and tungsten (W), an alloy containing any of these elements as a component, an alloy containing any of these elements in combination, or the like can be given. Alternatively, one or more materials selected from manganese (Mn), magnesium (Mg), zirconium (Zr), beryllium (Be), and yttrium (Y) may be used. Further, the metal conductive film may have a single-layer structure or a stacked structure of two or more layers. For example, the following structures can be given: a single-layer structure of an aluminum film including silicon, a single-layer structure of a copper film, or a film including copper as a main component, a two-layer structure in which a titanium film is stacked over an aluminum film, a two-layer structure in which a copper film is stacked over a tantalum nitride film or a copper nitride film, and a three-layer structure in which an aluminum film is stacked over a titanium film and another titanium film is stacked over the aluminum film. Alternatively, a film, an alloy film, or a nitride film which contains aluminum (Al) and one or more elements selected from titanium (Ti), tantalum (Ta), tungsten (W), molybdenum (Mo), chromium (Cr), neodymium (Nd), and scandium (Sc) may be used.

When heat treatment is performed after the formation of the metal conductive film, it is preferable that the metal conductive film have heat resistance high enough to withstand the heat treatment.

A resist mask is formed over the metal conductive film by a third photolithography step and etching is selectively performed, so that a source layer 415a and a drain layer 415b are formed. Then, the resist mask is removed (see FIG. 11C). Alternatively, the resist mask used in the process may be formed by an inkjet method. Formation of the resist mask by an inkjet method needs no photomask; thus, manufacturing cost can be reduced.

Note that materials and etching conditions are adjusted as appropriate so that the oxide semiconductor layer 431 is not removed by etching of the metal conductive film.

Here, a titanium film is used as the metal conductive film, an In—Ga—Zn—O based oxide is used for the oxide semiconductor layer 431, and an ammonia hydrogen peroxide mixture (a mixed solution of ammonia, water, and a hydrogen peroxide solution) is used.

Note that, in the third photolithography step, part of the oxide semiconductor layer 431 may be etched, whereby an oxide semiconductor layer having a groove (a depressed portion) is formed in some cases.

In order to reduce the number of photomasks used in a photolithography step and reduce the number of photolithography steps, an etching step may be performed with the use of a multi-tone mask which is a light-exposure mask through which light is transmitted to have a plurality of intensities. Since a resist mask formed using a multi-tone mask has a plurality of thicknesses and can be further changed in shape by performing ashing, the resist mask can be used in a plurality of etching steps to provide different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, plasma treatment using a gas such as nitrous oxide ($N_2O$), nitrogen ($N_2$), or argon (Ar) is performed. By this plasma treatment, absorbed water and the like attached to an exposed surface of the oxide semiconductor layer are removed. Plasma treatment may be performed using a mixed gas of oxygen and argon as well.

After the plasma treatment, an oxide insulating layer 416 which serves as a protective insulating film and is in contact with part of the oxide semiconductor layer is formed without exposure of the oxide semiconductor layer to the air.

The oxide insulating layer 416, which has a thickness of at least 1 nm, can be formed as appropriate using a sputtering method or the like, that is a method with which impurities such as water and hydrogen are not mixed into the oxide insulating layer 416. When hydrogen is contained in the oxide insulating layer 416, entry of the hydrogen to the oxide semiconductor layer is caused, whereby a back channel of the oxide semiconductor layer 431 comes to have a lower resistance (to be n-type) and thus a parasitic channel might be formed. Therefore, it is important that a deposition method in which hydrogen is not used is employed in order to form the oxide insulating layer 416 containing as little hydrogen as possible.

Here, a 200-nm-thick silicon oxide film is deposited as the oxide insulating layer 416 by a sputtering method. The substrate temperature in deposition may be from room temperature to 300° C. inclusive and here, is 100° C. Formation of a silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target can be used. For example, the silicon oxide film can be formed using a silicon target by a sputtering method in an atmosphere of oxygen and nitrogen.

Next, second heat treatment is performed in an inert gas atmosphere or an oxygen gas atmosphere (preferably at higher than or equal to 200° C. and lower than or equal to 400° C., e.g., higher than or equal to 250° C. and lower than or equal to 350° C.). For example, the second heat treatment is performed in a nitrogen atmosphere at 250° C. for one hour. Through the second heat treatment, part of the oxide semiconductor layer (a channel formation region) is heated while being in contact with the oxide insulating layer 416.

Thus, oxygen is supplied to the part of the oxide semiconductor layer (the channel formation region). Furthermore, hydrogen is transported from the oxide semiconductor layer to the oxide insulating layer 416 by this heat treatment.

Through the above steps, the oxide semiconductor layer is subjected to the heat treatment for dehydration or dehydrogenation, and then, the part of the oxide semiconductor layer (the channel formation region) is selectively made to be in an oxygen excess state. As a result, a channel formation region 413 overlapping with the gate layer 411 becomes i-type, and a source region 414a overlapping with the source layer 415a and a drain region 414b overlapping with the drain layer 415b are formed in a self-aligned manner. Through the above-described process, the transistor 410 is formed.

Under severe conditions (e.g., at 85° C. and $2\times10^6$ V/cm for 12 hours) such as those in a gate-bias thermal stress test (BT test), if an impurity (such as hydrogen) exists in an oxide semiconductor, the bond between the impurity and the main component of the oxide semiconductor is cleaved by a high electric field (B: bias) and high temperature (T: temperature), so that a generated dangling bond induces a drift in the threshold voltage ($V_{th}$). On the other hand, by removing impurities, especially hydrogen and water, in an oxide semiconductor as much as possible and using the high-density plasma CVD apparatus to form a dense and high-quality insulating film with high withstand voltage and good interface characteristics between the insulating film and an oxide semiconductor as described above, a transistor which is stable even under severe external environments can be obtained.

An additional heat treatment may be performed at higher than or equal to 100° C. lower than or equal to 200° C. for one hour to 30 hours in the air. Here, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed before formation of the oxide insulating layer 416 under a reduced pressure. Under the reduced pressure, the heat treatment time can be shortened.

By the formation of the drain region 414b in part of the oxide semiconductor layer, which overlaps with the drain layer 415b, reliability of the transistor can be improved. Specifically, by the formation of the drain region 414b, a structure in which conductivity can be varied from the drain layer 415b to the channel formation region 413 through the drain region 414b can be obtained.

Further the source region or the drain region in the oxide semiconductor layer is formed in the entire thickness direction in the case where the thickness of the oxide semiconductor layer is 15 nm or less. In the case where the thickness of the oxide semiconductor layer is 30 nm to 50 nm inclusive, in part of the oxide semiconductor layer, that is, in a region in the oxide semiconductor layer, which is in contact with the source layer or the drain layer, and the vicinity thereof, resistance is reduced and the source region or the drain region is formed, while a region in the oxide semiconductor layer, which is close to the gate insulating layer, can be made to be i-type.

A protective insulating layer may be further formed over the oxide insulating layer 416. For example, a silicon nitride film is formed by an RF sputtering method. Since an RF sputtering method has high productivity, it is preferably used as a deposition method of the protective insulating layer. As the protective insulating layer, an inorganic insulating film which does not include impurities such as moisture, a hydrogen ion, and OH⁻ and blocks entry of these species from the outside is used; for example, a silicon nitride film, an aluminum nitride film, a silicon nitride oxide film, an aluminum oxynitride film, or the like is used. Here, as the protective insulating layer, a protective insulating layer 403 is formed using a silicon nitride film (see FIG. 11D).

(Variety of Electronic Device on which Liquid Crystal Display Device is Mounted)

Examples of an electronic device on which the liquid crystal display device disclosed in this specification is mounted are described with reference to FIGS. 12A to 12F.

Figure 12A:
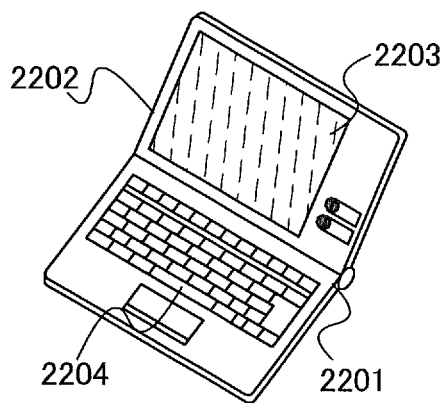
FIGS. 12A to 12F are diagrams illustrating examples of electronic devices.

FIG. 12A illustrates a laptop personal computer, which includes a main body 2201, a housing 2202, a display portion 2203, a keyboard 2204, and the like.

Figure 12B:
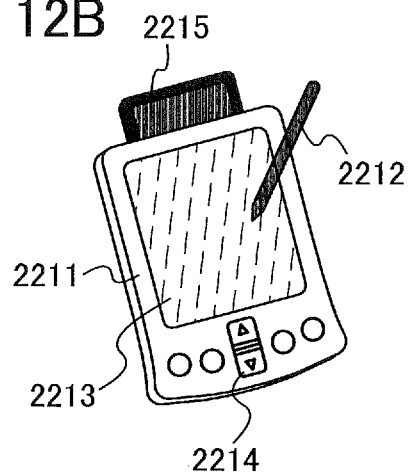

FIG. 12B illustrates a personal digital assistant (PDA), which includes a main body 2211 provided with a display portion 2213, an external interface 2215, operation buttons 2214, and the like. A stylus 2212 for operation is included as an accessory.

Figure 12C:
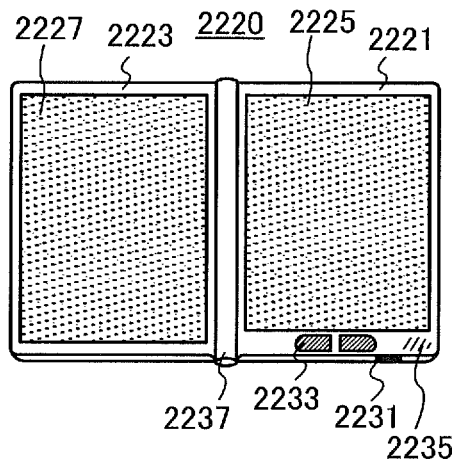

FIG. 12C illustrates an e-book reader 2220 as an example of an electronic paper. The e-book reader 2220 includes two housings, a housing 2221 and a housing 2223. The housings 2221 and 2223 are bound with each other by an axis portion 2237, along which the e-book reader 2220 can be opened and closed. With such a structure, the e-book reader 2220 can be used as a paper book.

A display portion 2225 is incorporated in the housing 2221, and a display portion 2227 is incorporated in the housing 2223. The display portion 2225 and the display portion 2227 may display one image or different images. In the structure where the display portions display different images from each other, for example, the right display portion (the display portion 2225 in FIG. 12C) can display text and the left display portion (the display portion 2227 in FIG. 12C) can display images.

Further, in FIG. 12C, the housing 2221 is provided with an operation portion and the like. For example, the housing 2221 is provided with a power supply switch 2231, operation keys 2233, a speaker 2235, and the like. With the operation keys 2233, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 2220 may have a function of an electronic dictionary.

The e-book reader 2220 may be configured to transmit and receive data wirelessly. Through wireless communication, desired book data or the like can be purchased and downloaded from an electronic book server.

Note that electronic paper can be applied to devices in a variety of fields as long as they display information. For example, electronic paper can be used for posters, advertisement in vehicles such as trains, display in a variety of cards such as credit cards, and the like in addition to e-book readers.

Figure 12D:
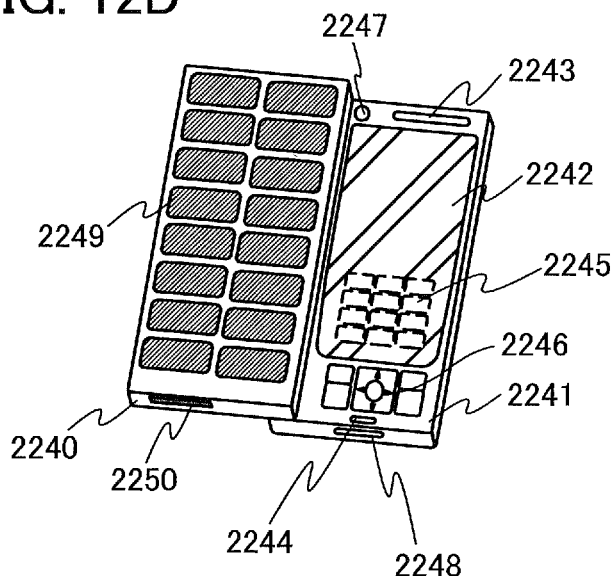

FIG. 12D illustrates a mobile phone. The mobile phone includes two housings, a housing 2240 and a housing 2241. The housing 2241 is provided with a display panel 2242, a speaker 2243, a microphone 2244, a pointing device 2246, a camera lens 2247, an external connection terminal 2248, and the like. The housing 2240 is provided with a solar cell 2249 which charges the mobile phone, an external memory slot 2250, and the like. An antenna is incorporated in the housing 2241.

The display panel 2242 has a touch panel function. A plurality of operation keys 2245 which is displayed as images is illustrated by dashed lines in FIG. 12D. Note that the mobile phone includes a booster circuit for increasing a voltage output from the solar cell 2249 to a voltage needed for each circuit. Moreover, the mobile phone can include a contactless IC chip, a small recording device, or the like in addition to the above structure.

The display orientation of the display panel 2242 changes as appropriate in accordance with the application mode. Further, the camera lens 2247 is provided on the same surface as the display panel 2242, and thus it can be used as a video phone. The speaker 2243 and the microphone 2244 can be used for videophone calls, recording, and playing sound, etc. as well as voice calls. Moreover, the housings 2240 and 2241 in a state where they are developed as illustrated in FIG. 12D can be slid so that one is lapped over the other; therefore, the size of the mobile phone can be reduced, which makes the mobile phone suitable for being carried.

The external connection terminal 2248 can be connected to a variety of cables such as an AC adapter or a USB cable, which enables charging of the mobile phone and data communication. Moreover, a larger amount of data can be saved and moved by inserting a recording medium to the external memory slot 2250. Further, in addition to the above functions, an infrared communication function, a television reception function, or the like may be provided.

Figure 12E:
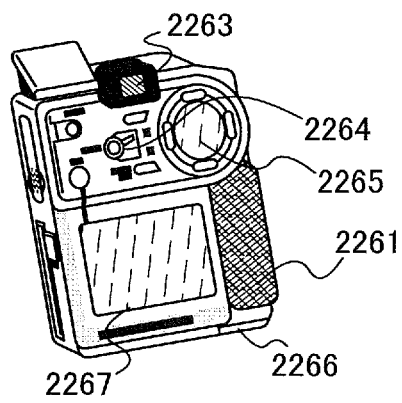

FIG. 12E illustrates a digital camera, which includes a main body 2261, a display portion (A) 2267, an eyepiece 2263, an operation switch 2264, a display portion (B) 2265, a battery 2266, and the like.

Figure 12F:
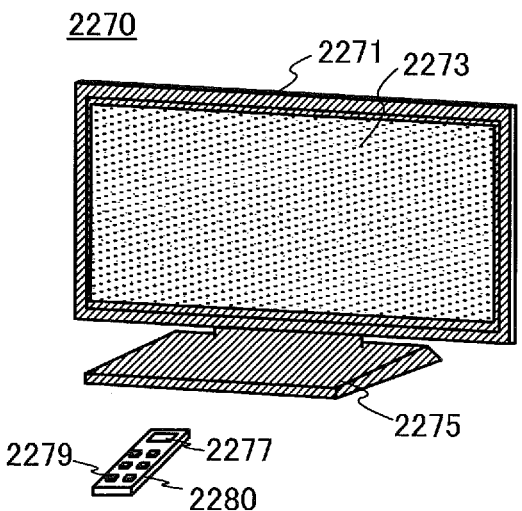

FIG. 12F illustrates a television set 2270, which includes a display portion 2273 incorporated in a housing 2271. The display portion 2273 can display images. Here, the housing 2271 is supported by a stand 2275.

The television set 2270 can be operated by an operation switch of the housing 2271 or a separate remote controller 2280. Channels and volume can be controlled with operation keys 2279 of the remote controller 2280 so that an image displayed on the display portion 2273 can be controlled. Moreover, the remote controller 2280 may have a display portion 2277 in which the information outgoing from the remote controller 2280 is displayed.

Note that the television set 2270 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed.

This application is based on Japanese Patent Application serial no. 2010-042584 filed with Japan Patent Office on Feb. 26, 2010, the entire contents of which are hereby incorporated by reference.

The invention claimed is:
1. A display device comprising:
 a first pixel electrically connected to a signal line and a first scan line, wherein the first pixel comprises a first transistor and a pixel electrode electrically connected to the first transistor; and a second pixel adjacent to the first pixel, the second pixel electrically connected to the signal line and a second scan line, wherein no conductive layer is provided under the signal line in a region between the first scan line and the second scan line, wherein the first transistor comprises:
   a gate layer comprising copper;
   a first insulating layer over the gate layer, the first insulating layer comprising silicon and nitrogen;
   a second insulating layer over the first insulating layer, the second insulating layer comprising silicon and oxygen; and
   an oxide semiconductor layer over and in contact with a top surface of the second insulating layer, the oxide semiconductor layer comprising indium, gallium, and zinc, wherein a third insulating layer is positioned over and in contact with a top surface of the oxide semiconductor layer, the third insulating layer comprising silicon and oxygen, wherein the oxide semiconductor layer comprises a channel formation region of the first transistor, wherein the signal line comprises:
   a first conductive layer comprising any one of titanium, molybdenum, and tungsten; and
   a second conductive layer over the first conductive layer, the second conductive layer comprising copper, wherein the signal line comprises a first region comprising a convex shape and a second region comprising a convex shape, wherein the signal line and the first scan line intersect in the first region, wherein the signal line and the second scan line intersect in the second region, wherein the signal line is substantially entirely flat in the region between the first region and the second region, wherein the signal line and the oxide semiconductor layer overlap each other in the first region, wherein the first conductive layer comprises a region in contact with the top surface of the oxide semiconductor layer in the first region, and wherein the signal line comprises a region not overlapping with the oxide semiconductor layer, in the region between the first region and the second region.

2. A display device comprising:
a first pixel electrically connected to a signal line and a first scan line, wherein the first pixel comprises a first transistor and a pixel electrode electrically connected to the first transistor; and
a second pixel adjacent to the first pixel, the second pixel electrically connected to the signal line and a second scan line, wherein no conductive layer is provided under the signal line in a region between the first scan line and the second scan line, wherein the first transistor comprises:
   a gate layer comprising copper;
   a first insulating layer over the gate layer, the first insulating layer comprising silicon and nitrogen;
   a second insulating layer over the first insulating layer, the second insulating layer comprising silicon and oxygen; and
   an oxide semiconductor layer over and in contact with a top surface of the second insulating layer, the oxide semiconductor layer comprising indium, gallium, and zinc, wherein a third insulating layer is positioned over and in contact with a top surface of the oxide semiconductor layer, the third insulating layer comprising silicon and oxygen, wherein the oxide semiconductor layer comprises a channel formation region of the first transistor, wherein the signal line comprises:
   a first conductive layer comprising a region in contact with the top surface of the oxide semiconductor layer, the first conductive layer comprising any one of titanium, molybdenum, and tungsten; and
   a second conductive layer over the first conductive layer, the second conductive layer comprising copper, wherein the signal line comprises a first region comprising a convex shape and a second region comprising a convex shape, wherein the signal line and the first scan line intersect in the first region, wherein the signal line and the second scan line intersect in the second region, wherein the signal line is substantially entirely flat in the region between the first region and the second region, wherein the signal line and the oxide semiconductor layer overlap each other in the first region, wherein the first conductive layer comprises a region in contact with the top surface of the oxide semiconductor layer in the first region, and wherein the signal line comprises a region not overlapping with the oxide semiconductor layer, in the region between the first region and the second region.

3. A display device comprising:
a first pixel electrically connected to a signal line and a first scan line, wherein the first pixel comprises a first transistor and a pixel electrode electrically connected to the first transistor; and
a second pixel adjacent to the first pixel, the second pixel electrically connected to the signal line and a second scan line, wherein no conductive layer is provided under the signal line in a region between the first scan line and the second scan line, wherein the first transistor comprises:
   a gate layer comprising copper;
   a first insulating layer over the gate layer, the first insulating layer comprising silicon and nitrogen;
   a second insulating layer over the first insulating layer, the second insulating layer comprising silicon and oxygen; and
   an oxide semiconductor layer over and in contact with a top surface of the second insulating layer, the oxide semiconductor layer comprising indium, gallium, and zinc, wherein a third insulating layer is positioned over and in contact with a top surface of the oxide semiconductor layer, the third insulating layer comprising silicon and oxygen, wherein the oxide semiconductor layer comprises a channel formation region of the first transistor, wherein the signal line comprises:
   a first conductive layer comprising any one of titanium, molybdenum, and tungsten; and a second conductive layer over the first conductive layer, the second conductive layer comprising copper, wherein the signal line comprises a first region comprising a convex shape and a second region comprising a convex shape, wherein the signal line and the first scan line intersect in the first region, wherein the signal line and the second scan line intersect in the second region, wherein the signal line is substantially entirely flat in the region between the first region and the second region, wherein the signal line and the oxide semiconductor layer overlap each other in the first region, wherein the first conductive layer comprises a region in contact with the top surface of the oxide semiconductor layer in the first region, wherein the signal line comprises a region not overlapping with the oxide semiconductor layer, in the region between the first region and the second region, and wherein the signal line and the pixel electrode do not overlap each other in the region between the first region and the second region.

4. A display device comprising:

a first pixel electrically connected to a signal line and a first scan line, wherein the first pixel comprises a first transistor and a pixel electrode electrically connected to the first transistor; and a second pixel adjacent to the first pixel, the second pixel electrically connected to the signal line and a second scan line, wherein no conductive layer is provided under the signal line in a region between the first scan line and the second scan line, wherein the first transistor comprises:
 a gate layer comprising copper;
 a first insulating layer over the gate layer, the first insulating layer comprising silicon and nitrogen;
 a second insulating layer over the first insulating layer, the second insulating layer comprising silicon and oxygen; and
 an oxide semiconductor layer over and in contact with a top surface of the second insulating layer, the oxide semiconductor layer comprising indium, gallium, and zinc, wherein a third insulating layer is positioned over and in contact with a top surface of the oxide semiconductor layer, the third insulating layer comprising silicon and oxygen, wherein the oxide semiconductor layer comprises a channel formation region of the first transistor, wherein the signal line comprises:
 a first conductive layer comprising a region in contact with the top surface of the oxide semiconductor layer, the first conductive layer comprising any one of titanium, molybdenum, and tungsten; and
 a second conductive layer over the first conductive layer, the second conductive layer comprising copper, wherein the signal line comprises a first region comprising a convex shape and a second region comprising a convex shape, wherein the signal line and the first scan line intersect in the first region, wherein the signal line and the second scan line intersect in the second region, wherein the signal line is substantially entirely flat in the region between the first region and the second region, wherein the signal line and the oxide semiconductor layer overlap each other in the first region, wherein the first conductive layer comprises a region in contact with the top surface of the oxide semiconductor layer in the first region, and wherein the signal line comprises a region not overlapping with the oxide semiconductor layer, in the region between the first region and the second region, and wherein the signal line and the pixel electrode do not overlap each other in the region between the first region and the second region.

\* \* \* \* \*